US012621984B2

(12) United States Patent
Guo

(10) Patent No.: US 12,621,984 B2
(45) Date of Patent: May 5, 2026

(54) SEMICONDUCTOR STRUCTURE AND FABRICATION METHOD THEREFOR

(71) Applicant: Changxin Memory Technologies, Inc., Anhui (CN)

(72) Inventor: Shuai Guo, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 378 days.

(21) Appl. No.: 18/195,309

(22) Filed: May 9, 2023

(65) Prior Publication Data

US 2023/0276617 A1 Aug. 31, 2023

Related U.S. Application Data

(63) Continuation of application No. PCT/CN2022/071594, filed on Jan. 12, 2022.

(30) Foreign Application Priority Data

Sep. 7, 2021 (CN) .......................... 202111044659.3

(51) Int. Cl.
*H01B 12/00* (2006.01)
*H01L 23/532* (2006.01)
(Continued)

(52) U.S. Cl.
CPC ..... *H10B 12/482* (2023.02); *H01L 23/53242* (2013.01); *H01L 23/53257* (2013.01);
(Continued)

(58) Field of Classification Search
CPC .... H10B 12/482; H10B 12/05; H10B 12/485; H10B 12/488; H01L 23/53242;
(Continued)

(56) References Cited

U.S. PATENT DOCUMENTS

| 5,828,094 A * | 10/1998 | Lee ......................... | H10B 12/34 |
| | | | 257/306 |
| 8,829,646 B2 * | 9/2014 | Lung ...................... | H10B 20/00 |
| | | | 257/530 |

(Continued)

FOREIGN PATENT DOCUMENTS

| CN | 101044615 A | 9/2007 |
| CN | 102097412 A | 6/2011 |

(Continued)

OTHER PUBLICATIONS

PCT International Search Report and the Written Opinion mailed Jun. 7, 2022, issued in related International Application No. PCT/CN2022/071594, with partial English translation (8 pages).

*Primary Examiner* — Jarrett J Stark
(74) *Attorney, Agent, or Firm* — Sheppard Mullin Richter & Hampton LLP

(57) ABSTRACT

This invention relates to a semiconductor structure and a fabrication method therefor. The method for fabricating a semiconductor structure includes: providing a substrate, where a shallow trench isolation structure is formed on the substrate; forming a plurality of transistor accommodating grooves in the active regions, where there is a spacing between the transistor accommodating groove and the shallow trench isolation structure; forming a columnar structure in the transistor accommodating groove, where the columnar structure includes a source, a conductive channel, and a drain that are sequentially disposed in a direction away from the substrate; etching the active region located within the spacing and the active region located between adjacent columnar structures in the same active region to form a bit line trench, where the bit line trench surrounds the source; and forming a bit line that surrounds and connects the source in the bit line trench.

14 Claims, 22 Drawing Sheets

(51) Int. Cl.
    *H10B 12/00*       (2023.01)
    *H10D 30/67*       (2025.01)

(52) U.S. Cl.
    CPC ........... *H10B 12/05* (2023.02); *H10B 12/485*
        (2023.02); *H10B 12/488* (2023.02); *H10D*
        *30/6729* (2025.01); *H10D 30/6735* (2025.01);
        *H10D 30/6757* (2025.01)

(58) Field of Classification Search
    CPC .......... H01L 23/53257; H10D 30/6729; H10D
        30/6735; H10D 30/6757
    See application file for complete search history.

(56)           References Cited

U.S. PATENT DOCUMENTS

| | | | |
|---|---|---|---|
| 9,000,409 B2 | 4/2015 | Huo et al. | |
| 10,186,551 B1* | 1/2019 | Kim ........................ | H10N 50/10 |
| 11,145,763 B2* | 10/2021 | Pillarisetty ............. | H10B 63/34 |
| 11,508,731 B1* | 11/2022 | Guo ..................... | H10B 12/482 |
| 2010/0163974 A1* | 7/2010 | Oh ........................ | H10B 12/053 |
| | | | 257/E21.573 |

| | | | |
|---|---|---|---|
| 2011/0073940 A1* | 3/2011 | Lee ..................... | H10D 30/6217 |
| | | | 438/270 |
| 2011/0101445 A1* | 5/2011 | Kim ....................... | H01L 21/185 |
| | | | 257/784 |
| 2011/0140196 A1* | 6/2011 | Renn ................... | H10B 12/056 |
| | | | 257/329 |
| 2011/0156134 A1* | 6/2011 | Kim ..................... | H10D 30/025 |
| | | | 257/329 |
| 2012/0171846 A1* | 7/2012 | Hwang ................ | H10B 12/482 |
| | | | 257/E21.09 |
| 2013/0140618 A1 | 6/2013 | Juengling | |
| 2019/0198571 A1 | 6/2019 | Xu et al. | |
| 2020/0006572 A1 | 1/2020 | Sharma et al. | |
| 2020/0044069 A1 | 2/2020 | Frougier et al. | |
| 2022/0068932 A1* | 3/2022 | Hwang ................ | H10D 62/124 |
| 2022/0069133 A1* | 3/2022 | Hwang ............. | H10D 86/0221 |
| 2023/0013383 A1* | 1/2023 | Miao ................... | H10D 84/038 |
| 2025/0201630 A1* | 6/2025 | Chang .............. | H01L 21/76831 |
| 2025/0227933 A1* | 7/2025 | Kim ....................... | H10B 43/50 |

FOREIGN PATENT DOCUMENTS

| | | |
|---|---|---|
| CN | 102544049 A | 7/2012 |
| CN | 111969058 A | 11/2020 |

* cited by examiner

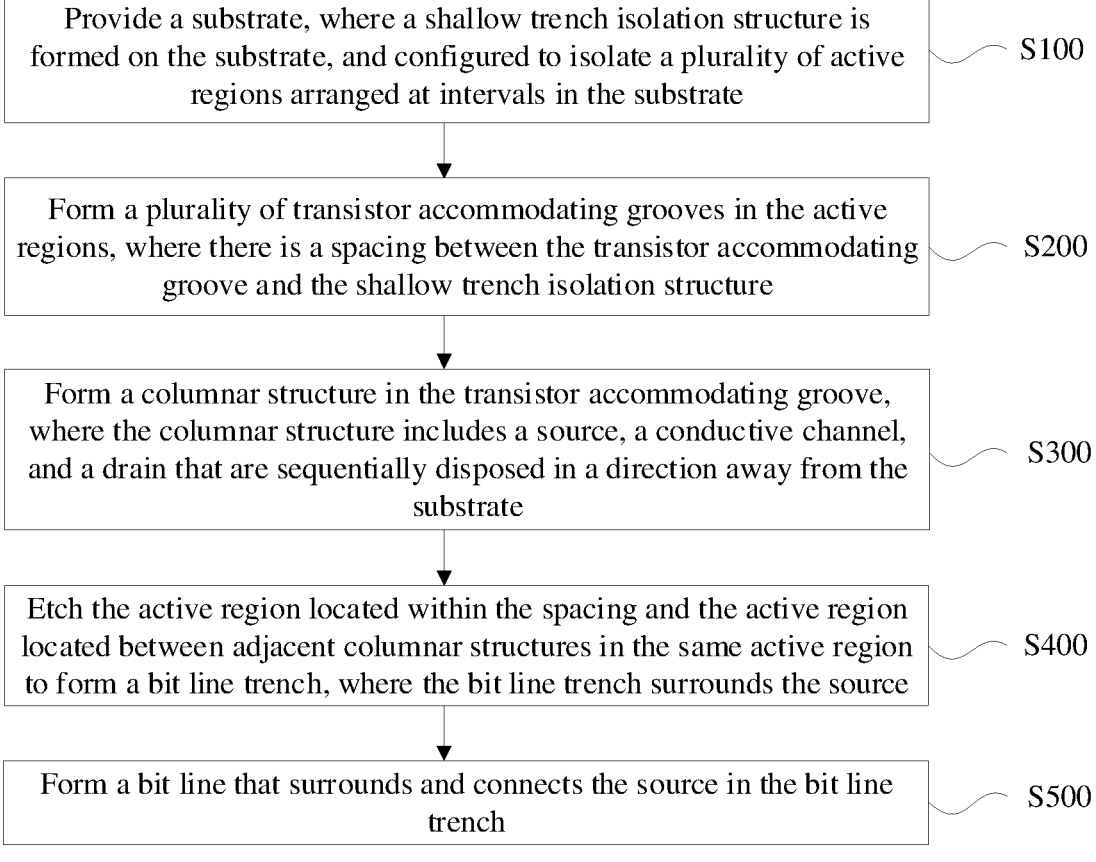

| | |
|---|---|
| Provide a substrate, where a shallow trench isolation structure is formed on the substrate, and configured to isolate a plurality of active regions arranged at intervals in the substrate | S100 |
| Form a plurality of transistor accommodating grooves in the active regions, where there is a spacing between the transistor accommodating groove and the shallow trench isolation structure | S200 |
| Form a columnar structure in the transistor accommodating groove, where the columnar structure includes a source, a conductive channel, and a drain that are sequentially disposed in a direction away from the substrate | S300 |
| Etch the active region located within the spacing and the active region located between adjacent columnar structures in the same active region to form a bit line trench, where the bit line trench surrounds the source | S400 |
| Form a bit line that surrounds and connects the source in the bit line trench | S500 |

FIG. 1

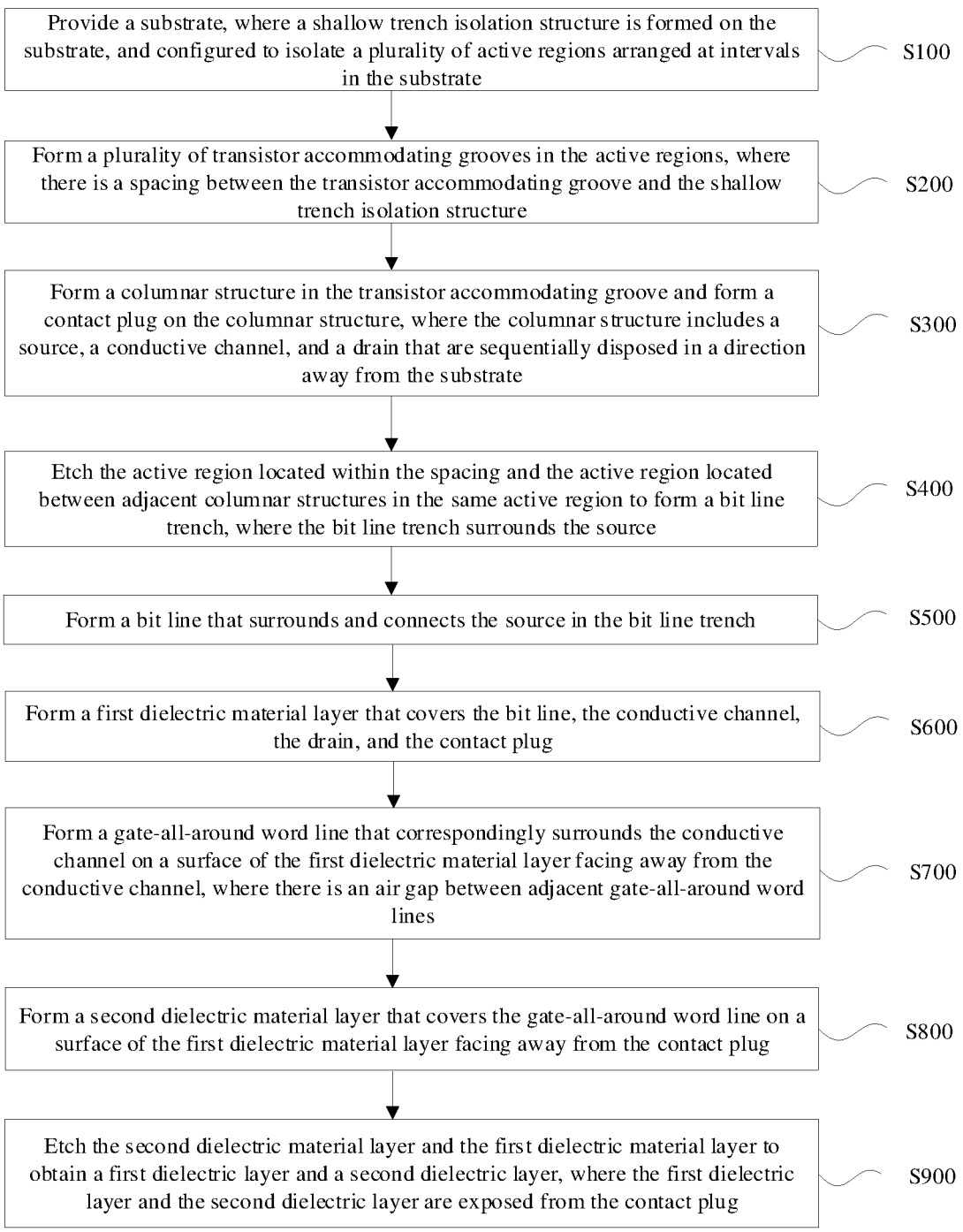

| | |
|---|---|
| Provide a substrate, where a shallow trench isolation structure is formed on the substrate, and configured to isolate a plurality of active regions arranged at intervals in the substrate | S100 |
| Form a plurality of transistor accommodating grooves in the active regions, where there is a spacing between the transistor accommodating groove and the shallow trench isolation structure | S200 |
| Form a columnar structure in the transistor accommodating groove and form a contact plug on the columnar structure, where the columnar structure includes a source, a conductive channel, and a drain that are sequentially disposed in a direction away from the substrate | S300 |
| Etch the active region located within the spacing and the active region located between adjacent columnar structures in the same active region to form a bit line trench, where the bit line trench surrounds the source | S400 |
| Form a bit line that surrounds and connects the source in the bit line trench | S500 |
| Form a first dielectric material layer that covers the bit line, the conductive channel, the drain, and the contact plug | S600 |
| Form a gate-all-around word line that correspondingly surrounds the conductive channel on a surface of the first dielectric material layer facing away from the conductive channel, where there is an air gap between adjacent gate-all-around word lines | S700 |
| Form a second dielectric material layer that covers the gate-all-around word line on a surface of the first dielectric material layer facing away from the contact plug | S800 |
| Etch the second dielectric material layer and the first dielectric material layer to obtain a first dielectric layer and a second dielectric layer, where the first dielectric layer and the second dielectric layer are exposed from the contact plug | S900 |

FIG. 2

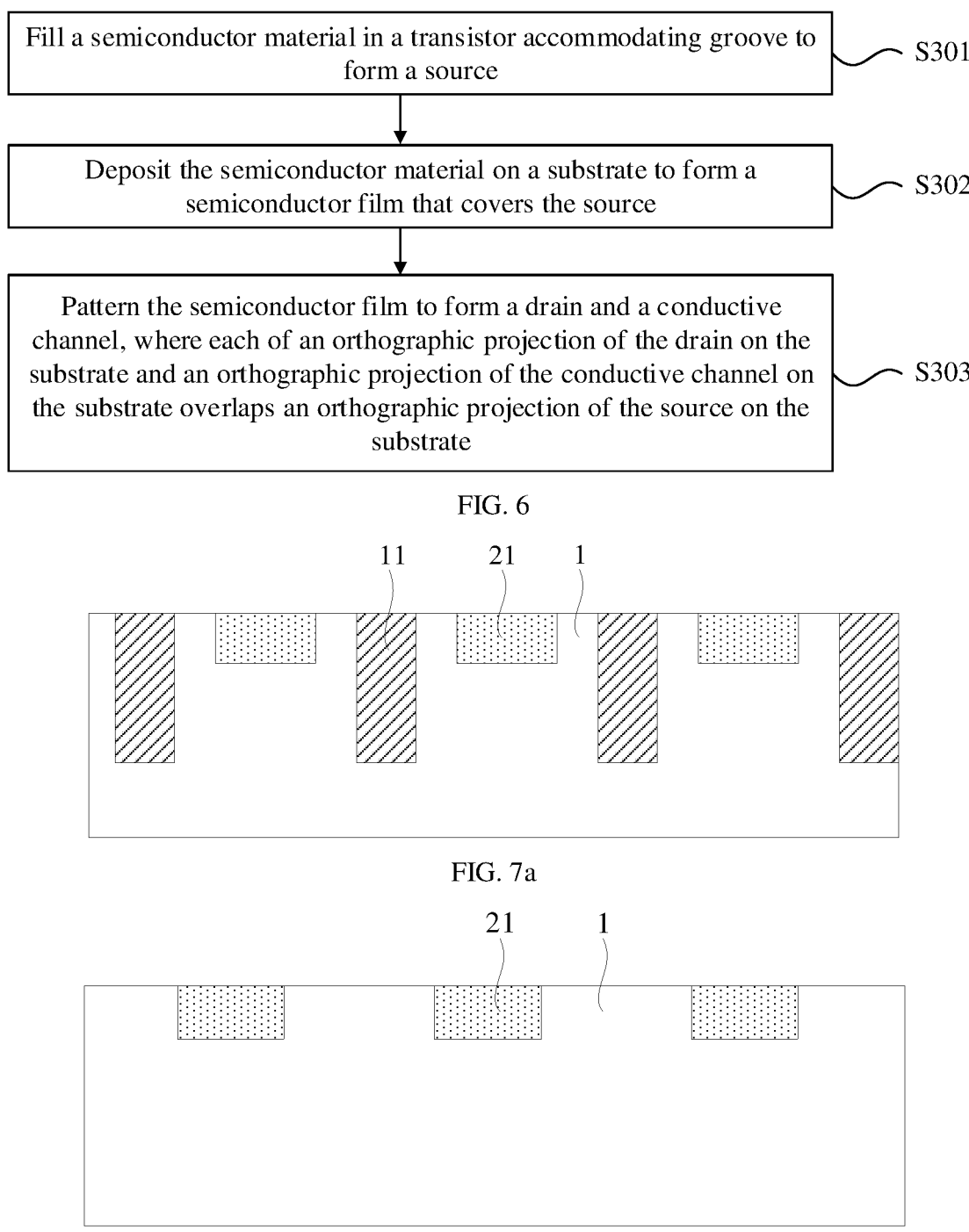

| Fill a semiconductor material in a transistor accommodating groove to form a source | S301 |

↓

| Deposit the semiconductor material on a substrate to form a semiconductor film that covers the source | S302 |

↓

| Pattern the semiconductor film to form a drain and a conductive channel, where each of an orthographic projection of the drain on the substrate and an orthographic projection of the conductive channel on the substrate overlaps an orthographic projection of the source on the substrate | S303 |

Form a first sacrificial layer that covers an exposed surface of a columnar structure and an exposed surface of a substrate — S401

Pattern the first sacrificial layer and etch an active region located within a spacing and an active region located between adjacent columnar structures in the same active region based on a pattern of the first sacrificial layer — S402

Remove the first sacrificial layer — S403

FIG. 11

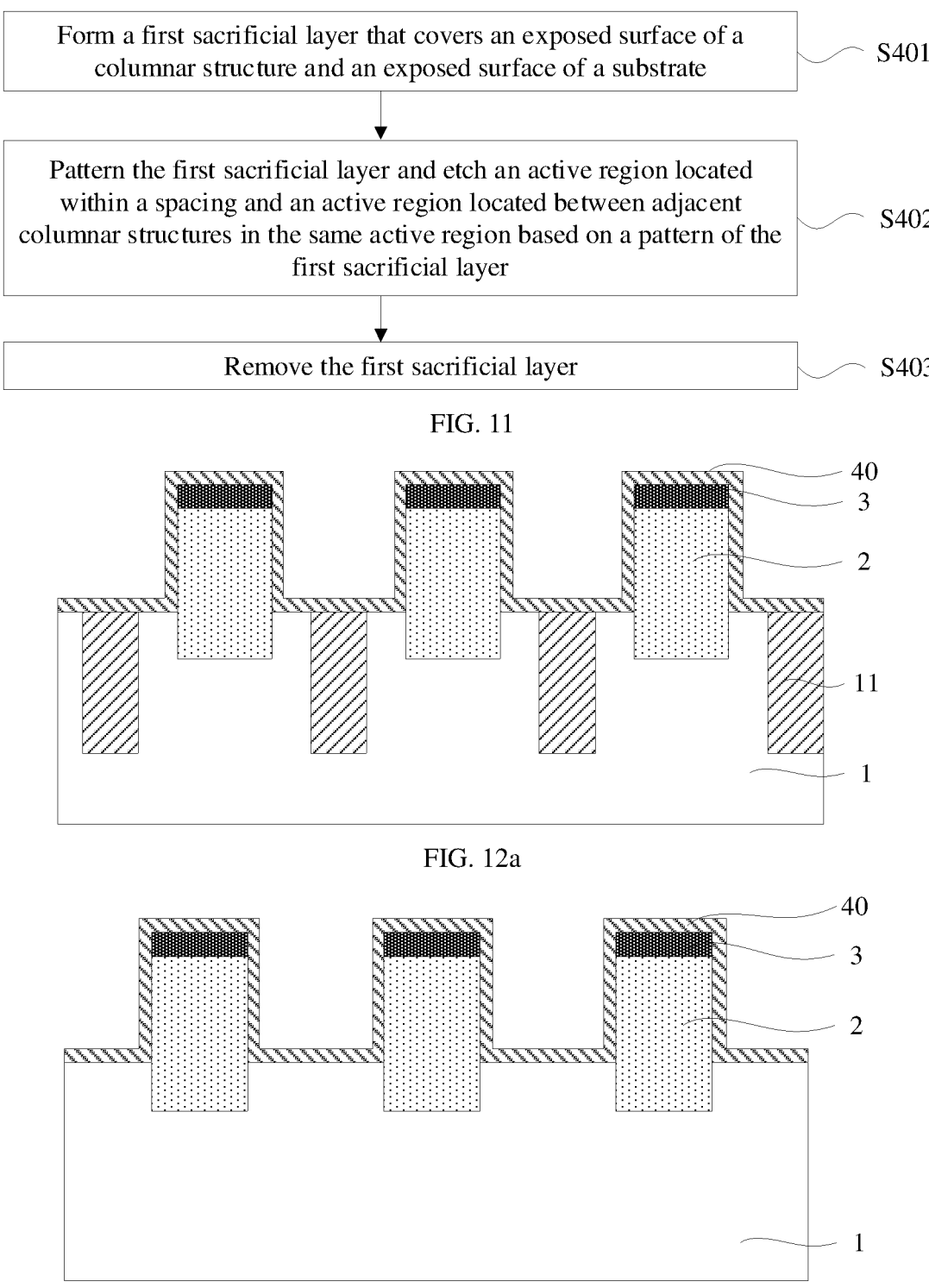

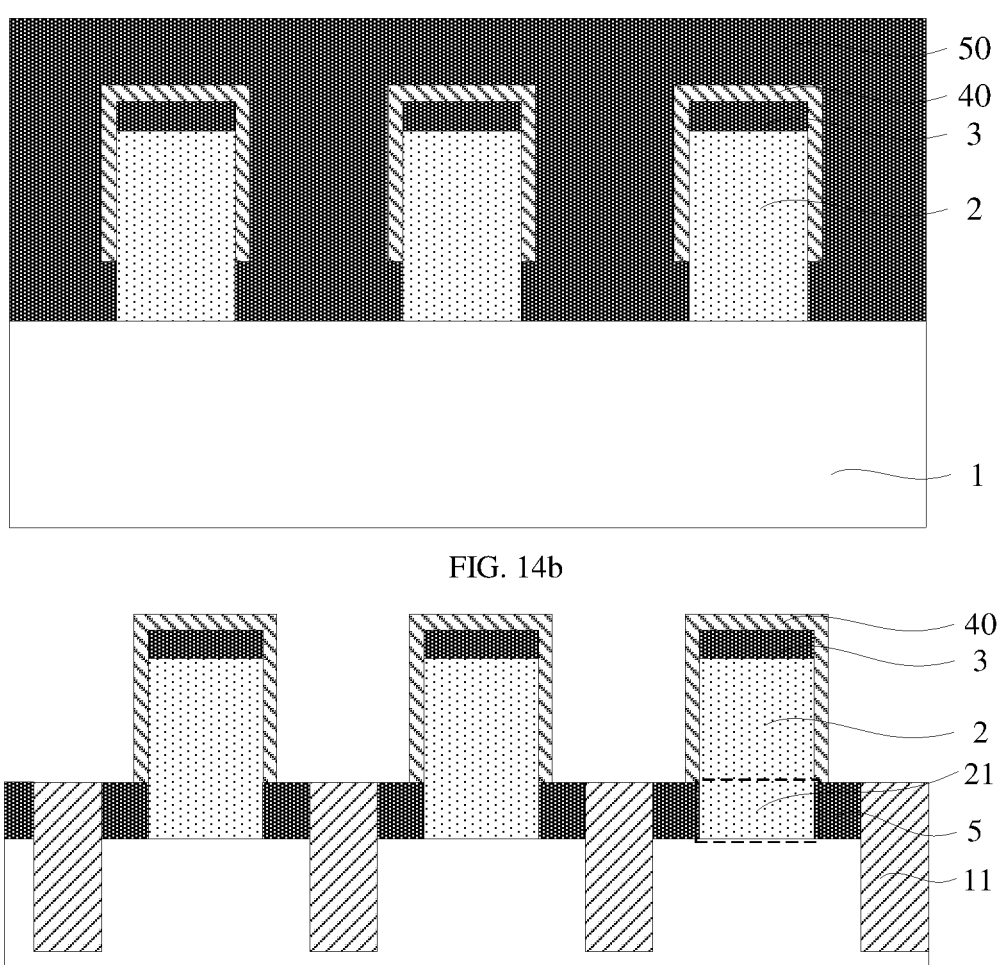
FIG. 14b
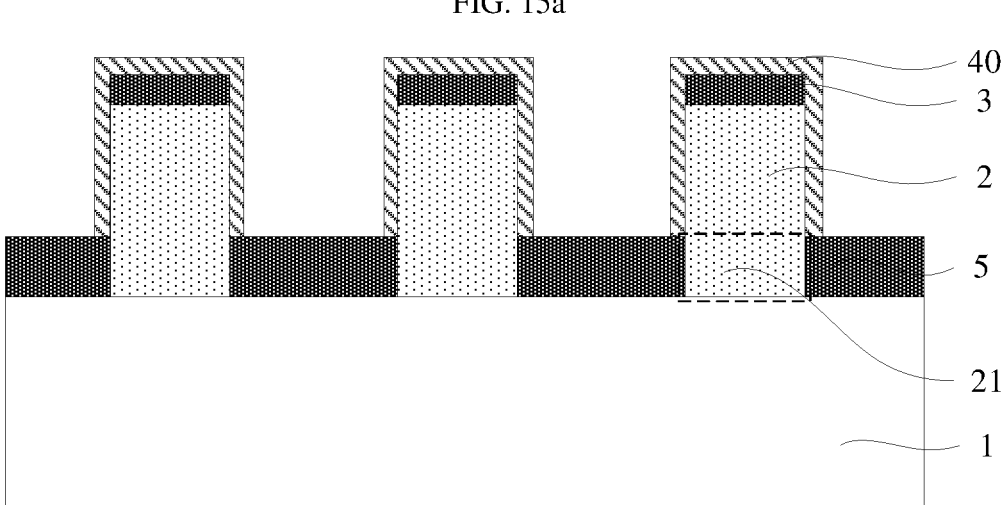
FIG. 15a
FIG. 15b

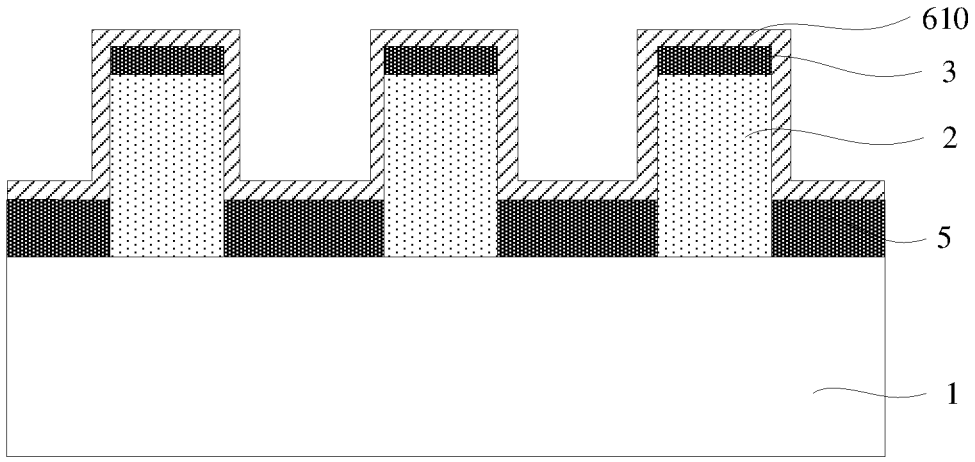

FIG. 17b

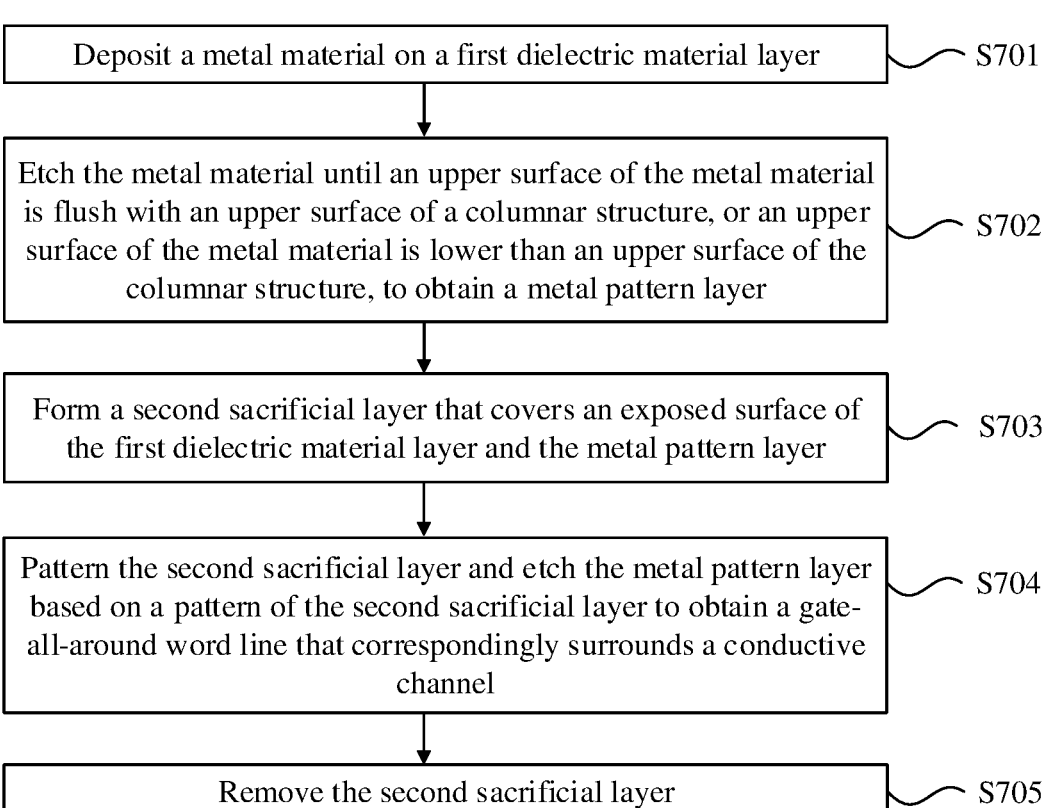

| | |
|---|---|
| Deposit a metal material on a first dielectric material layer | S701 |
| Etch the metal material until an upper surface of the metal material is flush with an upper surface of a columnar structure, or an upper surface of the metal material is lower than an upper surface of the columnar structure, to obtain a metal pattern layer | S702 |
| Form a second sacrificial layer that covers an exposed surface of the first dielectric material layer and the metal pattern layer | S703 |
| Pattern the second sacrificial layer and etch the metal pattern layer based on a pattern of the second sacrificial layer to obtain a gate-all-around word line that correspondingly surrounds a conductive channel | S704 |
| Remove the second sacrificial layer | S705 |

FIG. 18

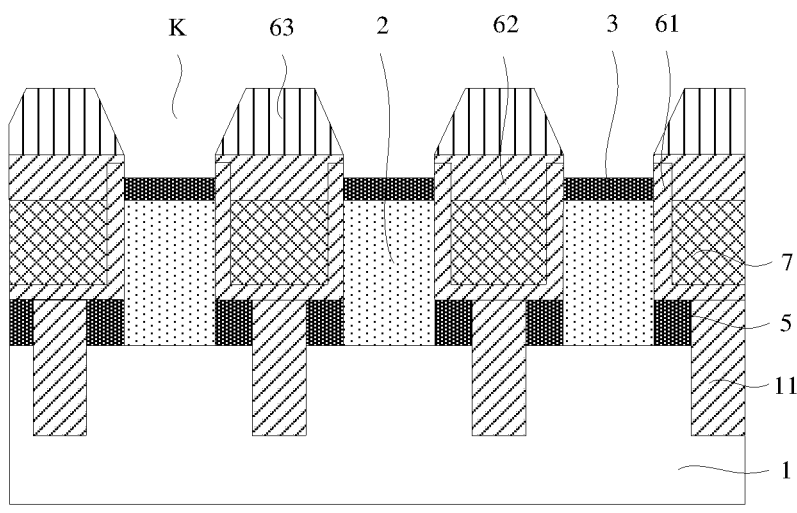
FIG. 27a
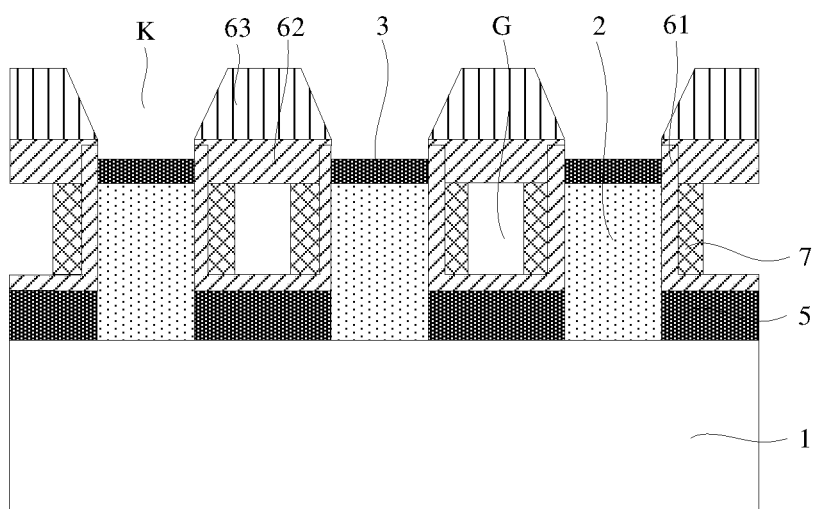
FIG. 27b
| | |
|---|---|
| Form a pad material layer in a contact window and on a surface of a third dielectric layer | S1001 |
| | |
|---|---|
| Remove the pad material layer on the surface of the third dielectric layer by using a chemical mechanical polishing process, where the pad material layer remaining in the contact window is a contact pad | S1002 |
FIG. 28

SEMICONDUCTOR STRUCTURE AND FABRICATION METHOD THEREFOR

CROSS-REFERENCE TO RELATED APPLICATIONS

This application is a continuation application of International Patent Application No. PCT/CN2022/071594, filed on Jan. 12, 2022, which claims priority to Chinese Patent Application No. 202111044659.3, filed with the China National Intellectual Property Administration on Sep. 7, 2021, and entitled "SEMICONDUCTOR STRUCTURE AND FABRICATION METHOD THEREFOR." The above-referenced applications are incorporated herein by reference in their entirety.

TECHNICAL FIELD

This invention relates to the field of semiconductor integrated circuit manufacturing technologies, and in particular, to a semiconductor structure and a fabrication method therefor.

BACKGROUND

Dynamic random access memory (DRAM) is a semiconductor memory commonly used in electronic devices such as computers. It is composed of a plurality of storage units, each of which includes a storage capacitor and a transistor electrically connected to the storage capacitor. The transistor includes a gate, a source region, and a drain region. The gate of the transistor is configured to electrically connect to a word line. The source region of the transistor is configured to form a bit line contact region for electrical connection to a bit line through a bit line contact structure. The drain region of the transistor is configured to form a storage node contact region for electrical connection to the storage capacitor through a storage node contact structure.

While using a vertical gate-all-around transistor (VGAA transistor) can effectively reduce the feature size of the DRAM, it can also lead to an excessively large contact resistance between the metal material and the semiconductor material due to the Schottky barrier and the metal-induced gap states (MIGS) when the channel width is continuously reduced. Consequently, the output current of the transistor might not meet the operation requirements of the DRAM, thereby adversely affecting the electrical performance of the DRAM.

SUMMARY

Some example embodiments of this invention provide a semiconductor structure and a fabrication method therefor.

Some embodiments of this invention provide a method for fabricating a semiconductor structure, including the following steps: providing a substrate, where a shallow trench isolation structure is formed on the substrate, and configured to isolate a plurality of active regions arranged at intervals in the substrate; forming a plurality of transistor accommodating grooves in the active regions, where there is a spacing between the transistor accommodating groove and the shallow trench isolation structure; forming a columnar structure in the transistor accommodating groove, where the columnar structure includes a source, a conductive channel, and a drain that are sequentially disposed in a direction away from the substrate; etching the active region located within the spacing and the active region located between adjacent columnar structures in the same active region to form a bit line trench, where the bit line trench surrounds the source; and forming a bit line that surrounds and connects the source in the bit line trench.

In some embodiments, the forming a columnar structure in the transistor accommodating groove includes the following steps: filling a semiconductor material in the transistor accommodating groove to form the source; depositing the semiconductor material on the substrate to form a semiconductor film that covers the source; and patterning the semiconductor film to form the drain and the conductive channel, where each of an orthographic projection of the drain on the substrate and an orthographic projection of the conductive channel on the substrate overlaps an orthographic projection of the source on the substrate.

In some embodiments, the etching the active region located within the spacing and the active region located between adjacent columnar structures in the same active region to form a bit line trench includes the following steps: forming a first sacrificial layer that covers an exposed surface of the columnar structure and an exposed surface of the substrate; patterning the first sacrificial layer and etching the active region located within the spacing and the active region located between adjacent columnar structures in the same active region based on a pattern of the first sacrificial layer; and removing the first sacrificial layer.

In some embodiments, before forming the bit line trench, the method for fabricating a semiconductor structure further includes forming a contact plug on the drain; and correspondingly, after the forming a bit line that surrounds and connects the source in the bit line trench, the method for fabricating a semiconductor structure further includes the following steps: forming a first dielectric material layer that covers the bit line, the conductive channel, the drain, and the contact plug; forming a gate-all-around word line that corresponds and surrounds the conductive channel on a surface of the first dielectric material layer facing away from the conductive channel, where there is an air gap between adjacent gate-all-around word lines; forming a second dielectric material layer that covers the gate-all-around word line on a surface of the first dielectric material layer facing away from the contact plug; and etching the second dielectric material layer and the first dielectric material layer to obtain a first dielectric layer and a second dielectric layer, where the contact plug is exposed from the first dielectric layer and the second dielectric layer.

In some embodiments, the forming a gate-all-around word line that corresponds and surrounds the conductive channel on a surface of the first dielectric material layer facing away from the conductive channel includes the following steps: depositing a metal material on the first dielectric material layer; etching the metal material until an upper surface of the metal material is flush with an upper surface of the columnar structure, or an upper surface of the metal material is lower than an upper surface of the columnar structure, to obtain a metal pattern layer; forming a second sacrificial layer that covers an exposed surface of the first dielectric material layer and the metal pattern layer; patterning the second sacrificial layer and etching the metal pattern layer based on a pattern of the second sacrificial layer to obtain the gate-all-around word line that corresponds and surrounds the conductive channel; and removing the second sacrificial layer.

In some embodiments, the metal material includes tungsten metal.

In some embodiments, before the etching the second dielectric material layer and the first dielectric material layer, the method for fabricating a semiconductor structure further includes: forming a third dielectric material layer on the second dielectric material layer; and forming a plurality of contact windows in the third dielectric material layer to obtain a third dielectric layer; correspondingly, the etching the second dielectric material layer and the first dielectric material layer to obtain a first dielectric layer and a second dielectric layer, where the contact plug is exposed from the first dielectric layer and the second dielectric layer includes: etching the second dielectric material layer and the first dielectric material layer based on the contact windows to obtain the first dielectric layer and the second dielectric layer, where the contact plug is exposed from the first dielectric layer and the second dielectric layer; and after the etching the second dielectric material layer and the first dielectric material layer to obtain a first dielectric layer and a second dielectric layer, where the contact plug is exposed from the first dielectric layer and the second dielectric layer, the method for fabricating a semiconductor structure further includes: forming a contact pad in contact with the contact plug in the contact window.

In some embodiments, the forming a contact pad in contact with the contact plug in the contact window includes the following steps: forming a pad material layer in the contact window and on a surface of the third dielectric layer; and removing the pad material layer on the surface of the third dielectric layer by using a chemical mechanical polishing process, where the pad material layer remaining in the contact window is the contact pad.

In some embodiments, a material of the bit line and/or the contact plug includes bismuth metal.

In some embodiments, a material of the columnar structure includes molybdenum disulfide.

Some embodiments of this invention further provide a semiconductor structure, which is fabricated using the fabrication method in some embodiments described above. The semiconductor structure includes a substrate, a transistor accommodating groove, a columnar structure, and a bit line. A shallow trench isolation structure is formed on the substrate, and configured to isolate a plurality of active regions arranged at intervals in the substrate. The transistor accommodating groove is located in the active region, and there is a spacing between the transistor accommodating groove and the shallow trench isolation structure. The columnar structure is located in the transistor accommodating groove and includes a source, a conductive channel, and a drain that are sequentially disposed in a direction away from the substrate. The bit line is located within the spacing and surrounds and connects the source.

In some embodiments, a material of the columnar structure includes molybdenum disulfide; and/or a material of the bit line includes bismuth metal.

In some embodiments, the semiconductor structure further includes a contact plug, a first dielectric layer, a gate-all-around word line, and a second dielectric layer. The contact plug is located on a surface of the drain facing away from the conductive channel. The first dielectric layer covers the bit line and is located on a sidewall of the conductive channel, the drain, and the contact plug. The gate-all-around word line is located on a surface of the first dielectric layer facing away from the conductive channel and surrounds the conductive channel. The second dielectric layer is located on a surface of the first dielectric layer facing away from the contact plug and covers the gate-all-around word line, and there is an air gap between adjacent gate-all-around word lines.

In some embodiments, the semiconductor structure further includes a third dielectric layer and a contact pad. The third dielectric layer has a contact window and covers at least the second dielectric layer. The contact pad is located in the contact window and is in contact with the contact plug. In some embodiments, a material of the contact plug includes bismuth metal.

BRIEF DESCRIPTION OF DRAWINGS

To describe the technical solutions in some embodiments of this invention more clearly, the following briefly describes the accompanying drawings needed for describing some embodiments of this invention. The accompanying drawings in the following description show merely some embodiments of this invention, and a person of ordinary skill in the art may derive other drawings from these accompanying drawings without creative efforts.

FIG. 1 is a flowchart of a method for fabricating a semiconductor structure according to some embodiments;

FIG. 2 is a flowchart of another method for fabricating a semiconductor structure according to some embodiments;

FIG. 6 is a flowchart of step S300 according to some embodiments;

FIG. 7*a* is a schematic cross-sectional view of a structure obtained in step S301 in a first direction according to some embodiments;

FIG. 7*b* is a schematic cross-sectional view of a structure obtained in step S301 in a second direction according to some embodiments;

FIG. 11 is a flowchart of step S400 according to some embodiments;

FIG. 12a is a schematic cross-sectional view of a structure obtained in step S401 in a first direction according to some embodiments;

FIG. 12b is a schematic cross-sectional view of a structure obtained in step S401 in a second direction according to some embodiments;

FIG. 14b is a schematic cross-sectional view of a structure obtained in step S501 in a second direction according to some embodiments;

FIG. 15a is a schematic cross-sectional view of a structure obtained in step S502 in a first direction according to some embodiments;

FIG. 15b is a schematic cross-sectional view of a structure obtained in step S502 in a second direction according to some embodiments;

FIG. 17b is a schematic cross-sectional view of a structure obtained in step S600 in a second direction according to some embodiments;

FIG. 18 is a flowchart of step S700 according to some embodiments;

FIG. 27a is a schematic cross-sectional view of a structure obtained in step S900 in a first direction according to some embodiments;

FIG. 27b is a schematic cross-sectional view of a structure obtained in step S900 in a second direction according to some embodiments;

FIG. 28 is a flowchart of step S1000 according to some embodiments;

FIG. 30a is also a schematic cross-sectional view of a semiconductor structure in a first direction according to some embodiments;

FIG. 30b is also a schematic cross-sectional view of a semiconductor structure in a second direction according to some embodiments.

DESCRIPTION OF EMBODIMENTS

Figure 3:
FIG. 3 is a flowchart of still another method for fabricating a semiconductor structure according to some embodiments.

To facilitate understanding of this invention, the following describes this invention in more detail with reference to related accompanying drawings. The accompanying drawings show some embodiments of this invention. However, this invention can be implemented in many different forms and is not limited to the some embodiments described herein. On the contrary, these embodiments are provided to make a more comprehensive disclosure of this invention.

Unless otherwise specified, all technical and scientific terms used in this specification have the same meanings as those usually understood by a person skilled in the art of this invention. Terms used in this specification of this invention are merely intended to describe some specific embodiments, but not to limit this invention.

It should be understood that when an element or a layer is referred to as "above", "adjacent to", "connected to", or "coupled to" another element or layer, the element or the layer may be directly above, adjacent to, connected to, or coupled to the another element or layer, or there may exist an intermediate element or layer. On the contrary, when an element is referred to as "directly above", "directly adjacent to", "directly connected to", or "directly coupled to" another element or layer, there is no intermediate element or layer.

It should be understood that although terms "first", "second", etc. may be used to describe various elements, components, regions, layers, doping types and/or portions, these elements, components, regions, layers, doping types and/or portions should not be limited by these terms. These terms are used merely to distinguish one element, component, region, layer, doping type or portion from another element, component, region, layer, doping type or portion. Therefore, a first element, component, region, layer, doping type or portion discussed below can be represented as a second element, component, region, layer or portion without departing from the teachings of the present invention.

Spatial relationship terms such as "below", "under", "underneath", "beneath", "above", or "over" may be used in this specification to describe a relationship between one element or feature and another element or feature shown in the figures. It should be understood that, in addition to the orientations shown in the figures, the spatial relationship terms further include different orientations of the devices in use and operation. For example, if a device in the drawings is flipped, an element or feature described as being "under another element", "thereunder", or "below it" should be oriented as "above" the another element or feature. Therefore, the example terms "under" and "below" may include two orientations of "above" and "under". In addition, the device may alternatively include additional orientations (e.g., rotation by 90 degrees or other orientations), and the spatial relationship terms used herein are interpreted accordingly.

As used herein, the singular forms of "a/an" "one", and "the/said" may also include the plural forms, unless otherwise specified in the context clearly. It should be further understood that the terms "including/comprising" or "having" and the like specify presence of the described features, entireties, steps, operations, components, portions, or combinations thereof, but do not preclude the possibility of presence or addition of one or more other features, entireties, steps, operations, components, portions, or combinations thereof. In addition, in this specification, the term "and/or" includes any or all combinations of related listed items.

Some embodiments of the present invention are described herein with reference to a schematic cross-sectional view of some desired embodiments (and intermediate structures) of the present invention, so that variations in the illustrated shapes caused by, for example, manufacturing techniques and/or tolerances can be anticipated. Therefore, the embodiments of the present invention should not be limited to the particular shapes of the regions shown herein, but also include shape deviations caused by, for example, manufacturing techniques. The regions shown in the figures are illustrative in nature and their shapes do not represent the actual shapes of the regions of the device and do not limit the scope of the present invention.

Gate-all-around transistor (GAA transistor) has advantages in terms of miniaturization, high performance, and low power consumption, and is considered to be a key core technology for the next generation of integrated circuits. Taking the vertical gate-all-around transistor as an example, it has more degrees of freedom in integration in the vertical direction, thereby effectively reducing the footprint occupied by the transistor, making it easier to achieve vertical stacking of multiple layers of devices, and further increasing the integration density by using a new wiring method.

However, disposing the GAA transistor in the semiconductor structure can lead to an excessively large contact resistance between a metal material and a semiconductor material due to the Schottky barrier and the metal-induced gap states (MIGS) when the size of the channel width is continuously reduced.

Based on this, referring to FIG. 1, some embodiments of this invention provide a method for fabricating a semiconductor structure, including the following steps:

S100: Provide a substrate, where a shallow trench isolation structure is formed on the substrate, and configured to isolate a plurality of active regions arranged at intervals in the substrate.

S200: Form a plurality of transistor accommodating grooves in the active regions, where there is a spacing between the transistor accommodating groove and the shallow trench isolation structure.

S300: Form a columnar structure in the transistor accommodating groove, where the columnar structure includes a source, a conductive channel, and a drain that are sequentially disposed in a direction away from the substrate.

S400: Etch the active region located within the spacing and the active region located between adjacent columnar structures in the same active region to form a bit line trench, where the bit line trench surrounds the source.

S500: Form a bit line that surrounds and connects the source in the bit line trench.

In some embodiments of this invention, a transistor accommodating groove is provided in an active region isolated by the shallow trench isolation structure, so that there is a spacing between the transistor accommodating groove and the shallow trench isolation structure. In this way, a columnar structure can be first formed in the transistor accommodating groove, and then the active region located within the spacing and the active region located between adjacent columnar structures in the same active region can be removed to obtain a bit line trench. After forming a bit line in the bit line trench, the bit line surrounds and connects the source. This can increase the contact area between the bit line and the source, thereby reducing the contact resistance between the bit line and the source (that is, the contact resistance between the bit line and the transistor), and improving the electrical performance of the semiconductor structure. Moreover, the fabrication method in some embodiments of this invention is easy to operate and facilitates large-scale production of the semiconductor structure.

In some embodiments, the material of the columnar structure includes molybdenum disulfide ($MoS_2$) and the material of the bit line includes bismuth (Bi) metal. As such, a two-dimensional crystalline structure of the columnar structure is not easily destroyed due to its contact with the bit line, and the contact resistance between the bit line and the transistor can be further reduced to ensure that the transistor has low power consumption performance and high frequency performance, thereby further improving the electrical performance of the semiconductor structure.

Certainly, the material of the columnar structure may be another two-dimensional semiconductor material, and the material of the bit line may be another material that is not easily alloyed with the two-dimensional semiconductor material to destroy the two-dimensional crystalline structure. For example, the material of the columnar structure is molybdenum diselenide ($MoSe_2$), tungsten disulfide ($WS_2$), tungsten diselenide ($WSe_2$), or bismuth selenide ($Bi_2Se_3$).

The material of the bit line is chromium (Cr), cadmium (Cd), iridium (Jr), niobium (Nb), tantalum (Ta), tellurium (Te), or tungsten (W).

Referring to FIG. 2, in some embodiments, before forming a bit line trench in S400, the method for fabricating a semiconductor structure further includes forming a contact plug on the drain.

In some embodiments, the contact plug as well as the conductive channel and the drain in the columnar structure are formed using a single patterning process. In other words, step S300 further includes forming a contact plug on the columnar structure.

In some embodiments, the material of the contact plug includes bismuth (Bi) metal. Alternatively, the material of the contact plug may be chromium (Cr), cadmium (Cd), iridium (Jr), niobium (Nb), tantalum (Ta), tellurium (Te), or tungsten (W). This is to ensure that there is also a low contact resistance between the contact plug and the transistor.

Based on this, after performing S500 of forming a bit line that surrounds and connects the source in the bit line trench, the method for fabricating a semiconductor structure further includes the following steps:

S600: Form a first dielectric material layer that covers the bit line, the conductive channel, the drain, and the contact plug.

S700: Form a gate-all-around word line that corresponds and surrounds the conductive channel on a surface of the first dielectric material layer facing away from the conductive channel, where there is an air gap between adjacent gate-all-around word lines.

S800: Form a second dielectric material layer that covers the gate-all-around word line on a surface of the first dielectric material layer facing away from the contact plug.

S900: Etch the second dielectric material layer and the first dielectric material layer to obtain a first dielectric layer and a second dielectric layer, where the contact plug is exposed from the first dielectric layer and the second dielectric layer.

In some embodiments of this invention, an air gap is provided between adjacent gate-all-around word lines, and the gate word lines can be effectively isolated by the air gap to ensure the electrical performance of the semiconductor structure.

Referring to FIG. 3, in some embodiments, before performing step S900 of etching the second dielectric material layer and the first dielectric material layer, the method for fabricating a semiconductor structure further includes the following steps:

S850: Form a third dielectric material layer on the second dielectric material layer.

S860: Form a plurality of contact windows in the third dielectric material layer to obtain a third dielectric layer.

Based on this, step S900 of etching the second dielectric material layer and the first dielectric material layer to obtain a first dielectric layer and a second dielectric layer, where the contact plug is exposed from the first dielectric layer and the second dielectric layer includes: etching the second dielectric material layer and the first dielectric material layer based on the contact windows to obtain the first dielectric layer and the second dielectric layer, where the contact plug is exposed from the first dielectric layer and the second dielectric layer.

After performing S900 of etching the second dielectric material layer and the first dielectric material layer to obtain a first dielectric layer and a second dielectric layer, where the contact plug is exposed from the first dielectric layer and the second dielectric layer, the method for fabricating a semiconductor structure further includes the following steps:

S1000: Form a contact pad in contact with the contact plug in the contact window. The structure of the contact pad can be selected and disposed according to actual requirements. In some embodiments, the contact pad is a metal pad such as a tungsten pad. As such, it can be ensured that the contact pad has a small resistance value and high stability.

In addition, in some embodiments, the contact plug and the contact pad can jointly form a storage node contact structure, which is configured to connect a storage capacitor to form a storage unit. This is not limited in some embodiments of this invention.

The above embodiments provide examples of some processes in the method for fabricating a semiconductor structure, and the corresponding specific implementations are detailed in the following embodiments. The following content should be understood with reference to the some of the above processes.

Figure 4A:
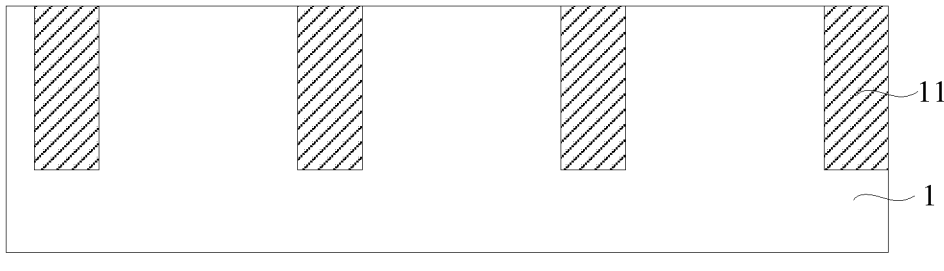
FIG. 4*a* is a schematic cross-sectional view of a structure obtained in step S100 in a first direction according to some embodiments, where the first direction is an extension direction of a gate-all-around word line.
Figure 4B:
FIG. 4*b* is a schematic cross-sectional view of a structure obtained in step S100 in a second direction according to some embodiments, where the second direction is an extension direction of a bit line.

In step S100, referring to S100 in FIG. 1 to FIG. 3 and referring to FIG. 4a and FIG. 4b, a substrate 1 is provided, where a shallow trench isolation structure 11 is formed on the substrate 1, and configured to isolate a plurality of active regions arranged at intervals in the substrate 1.

In some embodiments, the substrate 1 includes, but is not limited to, a silicon substrate or a silicon-based substrate. In some embodiments, the substrate 1 is a sapphire substrate, a silicon substrate, or a silicon carbide substrate.

In some embodiments, the material of the active region is, for example, polysilicon (poly). The shallow trench isolation structure 11 is, for example, a silicon oxide ($SiO_2$) isolation structure. In addition, the arrangement manner of the active regions can be understood based on related technologies, which is not limited in some embodiments of this invention.

Figure 5A:
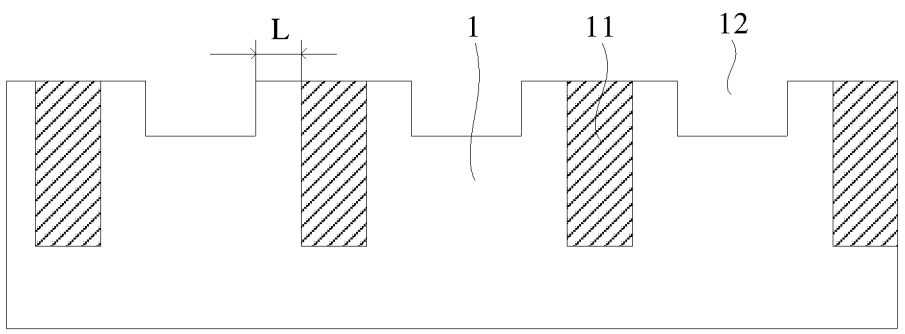
FIG. 5*a* is a schematic cross-sectional view of a structure obtained in step S200 in a first direction according to some embodiments.
Figure 5B:
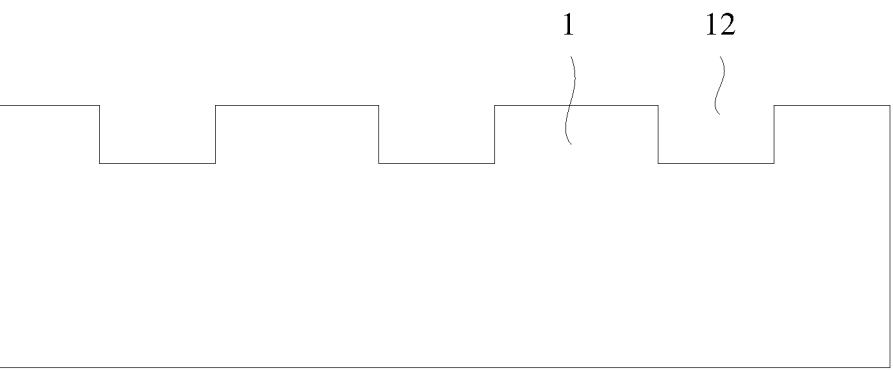
FIG. 5*b* is a schematic cross-sectional view of a structure obtained in step S200 in a second direction according to some embodiments.

In step S200, referring to S200 in FIG. 1 to FIG. 3 and referring to FIG. 5a and FIG. 5b, a plurality of transistor accommodating grooves 12 are formed in the active regions, where there is a spacing L between the transistor accommodating groove 12 and the shallow trench isolation structure 11.

Here, the shape and size of the transistor accommodating groove 12 and the size of the spacing L can be selected and set according to actual requirements, which are not limited in some embodiments of this invention. In some embodiments, the transistor accommodating groove 12 is, for example, a columnar groove.

In step S300, referring to FIG. 1, FIG. 2, FIG. 3, and FIG. 6, performing step S300, that is, forming a columnar structure in the transistor accommodating groove, includes the following steps:

S301: Fill a semiconductor material in the transistor accommodating groove to form the source.

S302: Deposit the semiconductor material on the substrate to form a semiconductor film that covers the source.

S303: Pattern the semiconductor film to form the drain and the conductive channel. Each of the orthographic projection of the drain on the substrate and the orthographic projection of the conductive channel on the substrate overlaps the orthographic projection of the source on the substrate.

In step S301, referring to S301 in FIG. 4 and referring to FIG. 7a and FIG. 7b, a semiconductor material is filled in the transistor accommodating groove 12 to form the source 21.

In some embodiments, the semiconductor material is a two-dimensional semiconductor material, such as a transition metal disulfide. In some embodiments, the semiconductor material is molybdenum disulfide ($MoS_2$), molybdenum diselenide (MoSe$_2$), tungsten disulfide (WS$_2$), tungsten diselenide (WSe$_2$), or bismuth selenide (Bi$_2$Se$_3$).

Figure 8A:
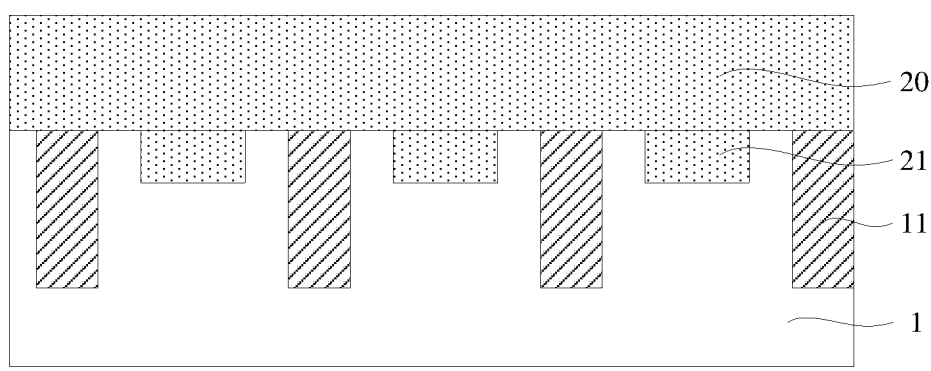
FIG. 8*a* is a schematic cross-sectional view of a structure obtained in step S302 in a first direction according to some embodiments.
Figure 8B:
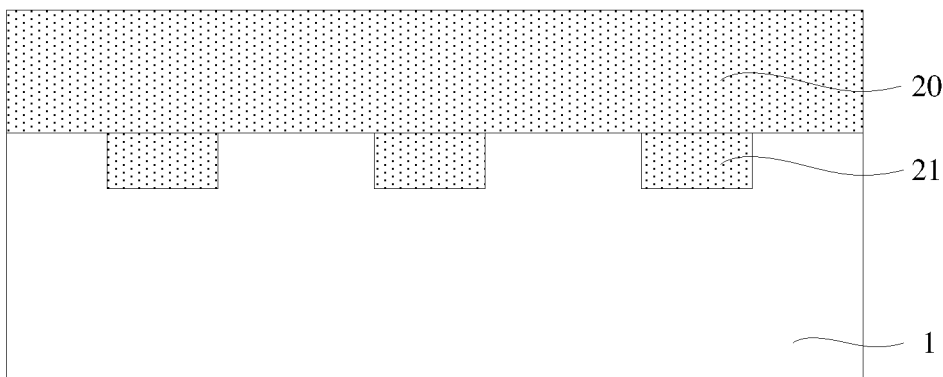
FIG. 8*b* is a schematic cross-sectional view of a structure obtained in step S302 in a second direction according to some embodiments.

In step S302, referring to S302 in FIG. 4 and referring to FIG. 8$a$ and FIG. 8$b$, the semiconductor material is deposited on the substrate 1 to form a semiconductor film 20 that covers the source 21.

Here, the semiconductor material for forming the semiconductor film 20 may be the same as the semiconductor material for forming the source 21 in S301 to ensure that the semiconductor film 20 to be well bonded to the source 21.

In addition, the thickness of the semiconductor film 20 can be determined based on the height of the columnar structure to be subsequently formed.

In some embodiments, the deposition process of the semiconductor material includes, but is not limited to, physical vapor deposition (PVD), chemical vapor deposition (CVD), or atomic layer deposition (ALD).

Figure 9A:
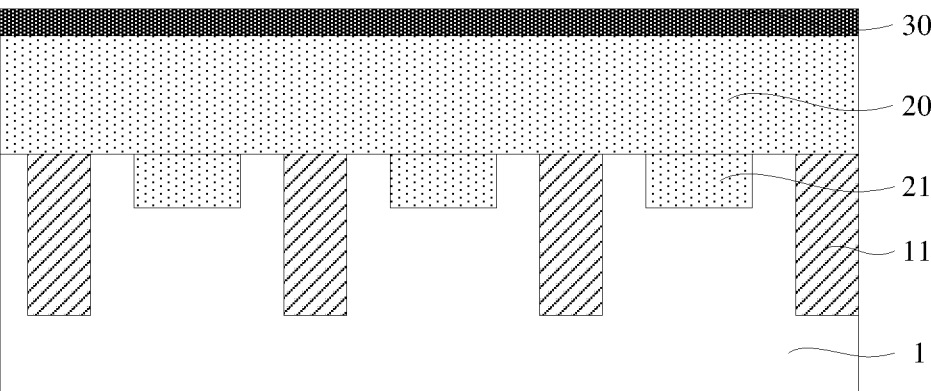
FIG. 9*a* is a schematic cross-sectional view of a structure obtained after forming a contact plug material layer in a first direction according to some embodiments.
Figure 9B:
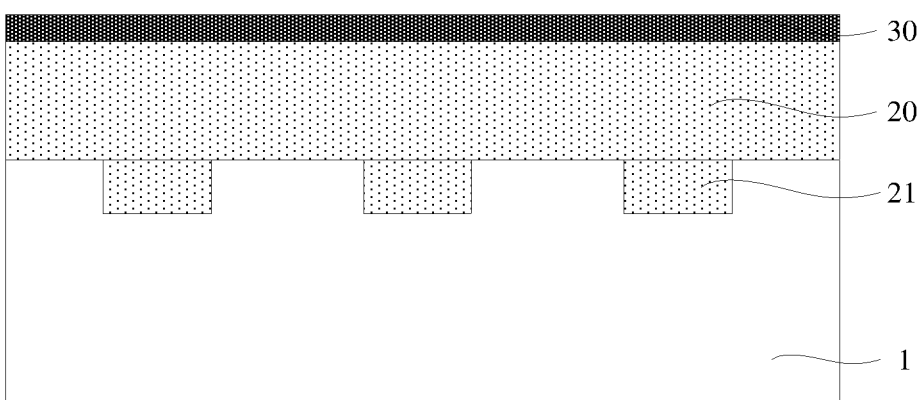
FIG. 9*b* is a schematic cross-sectional view of a structure obtained after forming a contact plug material layer in a second direction according to some embodiments.

In some embodiments, it should be understood with reference to FIG. 2 that, the contact plug as well as the conductive channel and the drain in the columnar structure can be formed using a single patterning process. Based on this, referring to FIG. 9$a$ and FIG. 9$b$, after forming the semiconductor film 20, the method for fabricating a semiconductor structure further includes depositing a contact plug material layer 30 on the semiconductor film 20.

In some embodiments, the contact plug material layer 30 includes a bismuth metal layer. In addition, in some embodiments, the material of the contact plug material layer 30 may alternatively be chromium (Cr), cadmium (Cd), iridium (Jr), niobium (Nb), tantalum (Ta), tellurium (Te), or tungsten (W), etc.

In some embodiments, the deposition process of the contact plug material layer 30 includes, but is not limited to, physical vapor deposition (PVD), chemical vapor deposition (CVD), or atomic layer deposition (ALD).

Figure 10A:
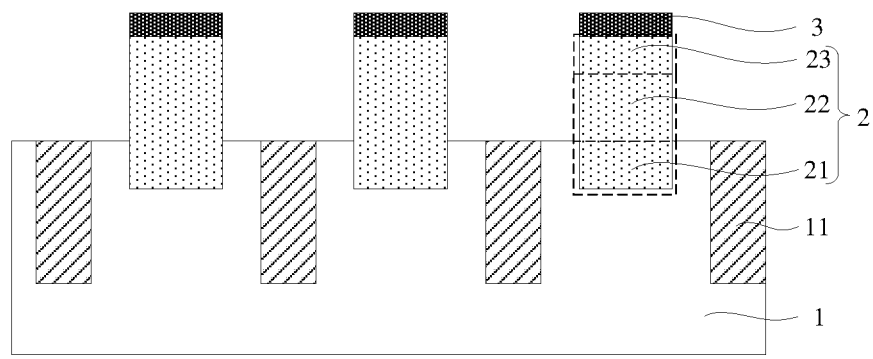
FIG. 10*a* is a schematic cross-sectional view of a structure obtained in step S303 in a first direction according to some embodiments.
Figure 10B:
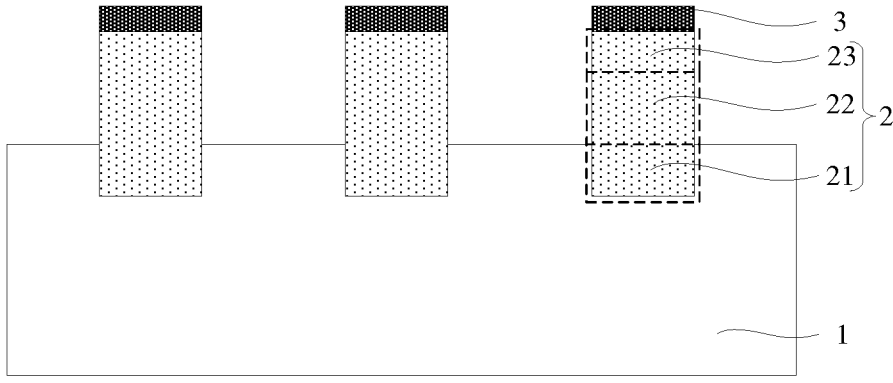
FIG. 10*b* is a schematic cross-sectional view of a structure obtained in step S303 in a second direction according to some embodiments.

In step S303, referring to S303 in FIG. 4 and referring to FIG. 10$a$ and FIG. 10$b$, the semiconductor film 20 is patterned to form the drain 23 and the conductive channel 22. Each of the orthographic projection of the drain 23 on the substrate 1 and the orthographic projection of the conductive channel 22 on the substrate 1 overlaps the orthographic projection of the source 21 on the substrate 1. As such, the drain 23, the conductive channel 22, and the source 21 are disposed in a columnar shape to jointly form the columnar structure 2.

It can be understood that the source 21 and the drain 23 can be obtained through ion implantation for the semiconductor material. This is not specifically described in some embodiments of this invention.

Based on the fact that the contact plug material layer 30 is formed on the semiconductor film 20, after the semiconductor film 20 is patterned, the contact plug material layer 30 can also be synchronously patterned to form the contact plug 3 on the columnar structure 2, as shown in FIG. 10$a$ and FIG. 10$b$.

In step S400, referring to FIG. 1, FIG. 2, FIG. 3, and FIG. 11, performing step S400, that is, etching the active region located within the spacing and the active region located between adjacent columnar structures in the same active region to form a bit line trench, includes the following steps:

S401: Form a first sacrificial layer that covers an exposed surface of the columnar structure and an exposed surface of the substrate.

S402: Pattern the first sacrificial layer and etch the active region located within the spacing and the active region located between adjacent columnar structures in the same active region based on a pattern of the first sacrificial layer.

S403: Remove the first sacrificial layer.

In step S401, referring to S401 in FIG. 11 and referring to FIG. 12$a$ and FIG. 12$b$, a first sacrificial layer 40 that covers an exposed surface of the columnar structure 2 and an exposed surface of the substrate 1 is formed.

In some embodiments, the first sacrificial layer 40 is formed using a deposition process. The material of the first sacrificial layer 40 is, for example, silicon nitride.

Figure 13A:
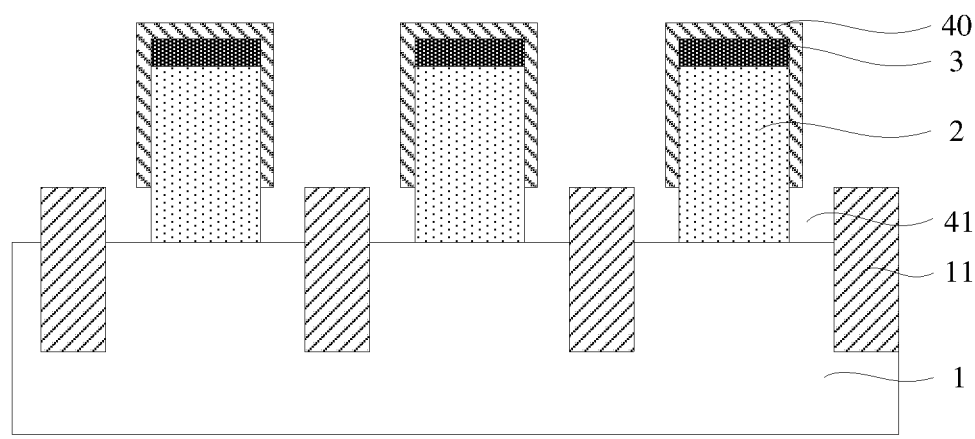
FIG. 13a is a schematic cross-sectional view of a structure obtained in step S402 in a first direction according to some embodiments.
Figure 13B:
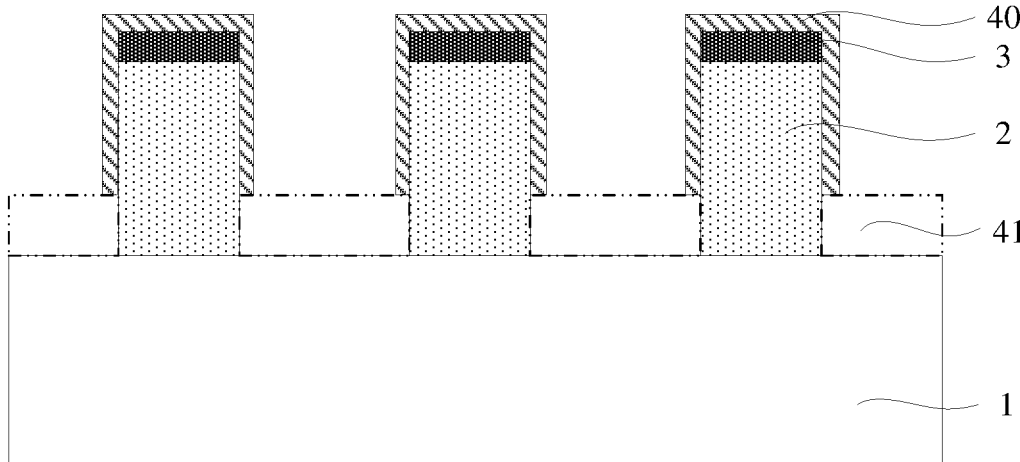
FIG. 13b is a schematic cross-sectional view of a structure obtained in step S402 in a second direction according to some embodiments.

In step S402, referring to S402 in FIG. 11 and referring to FIG. 13$a$ and FIG. 13$b$, the first sacrificial layer 40 is patterned and the active region located within the spacing L and the active region located between adjacent columnar structures 2 in the same active region are etched based on a pattern of the first sacrificial layer 40 to form a bit line trench 41. The bit line trench 41 surrounds the source 21.

In some embodiments, the process of patterning the first sacrificial layer 40 is, for example, a wet etching process.

In some embodiments, the etching of the active region to be removed can be implemented using a self-aligned double patterning (SADP) process or a self-aligned quadruple patterning (SAQP) process based on the pattern of the first sacrificial layer 40.

It can be understood that, in some embodiments, step S403 may be performed after step S500. Such an example is used below in some embodiments of this invention for description purposes.

Figure 14A:
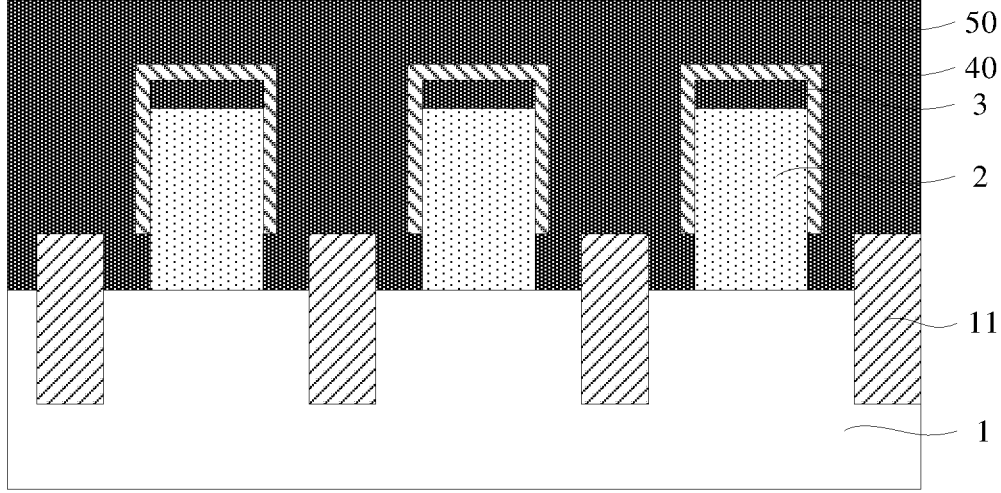
FIG. 14a is a schematic cross-sectional view of a structure obtained in step S501 in a first direction according to some embodiments.

In step S500, referring to FIG. 14$a$, FIG. 14$b$, FIG. 15$a$, and FIG. 15$b$, forming a bit line 5 that surrounds and connects the source 21 in the bit line trench 41 includes the following steps:

S501: Referring to FIG. 14$a$ and FIG. 14$b$, a bit line material layer 50 that fills the bit line trench 41 and covers the exposed surface of the first sacrificial layer 40 is formed.

In some embodiments, the bit line material layer 50 includes a bismuth metal layer.

S502: Referring to FIG. 15$a$ and FIG. 15$b$, the bit line material layer 50 is patterned to form a bit line 5 located in the bit line trench 41 and surrounds and connects the source 21.

In some embodiments, the patterning of the bit line material layer 50 can be implemented using a self-aligned double patterning (SADP) process or a self-aligned quadruple patterning (SAQP) process based on the pattern of the first sacrificial layer 40.

Figure 16A:
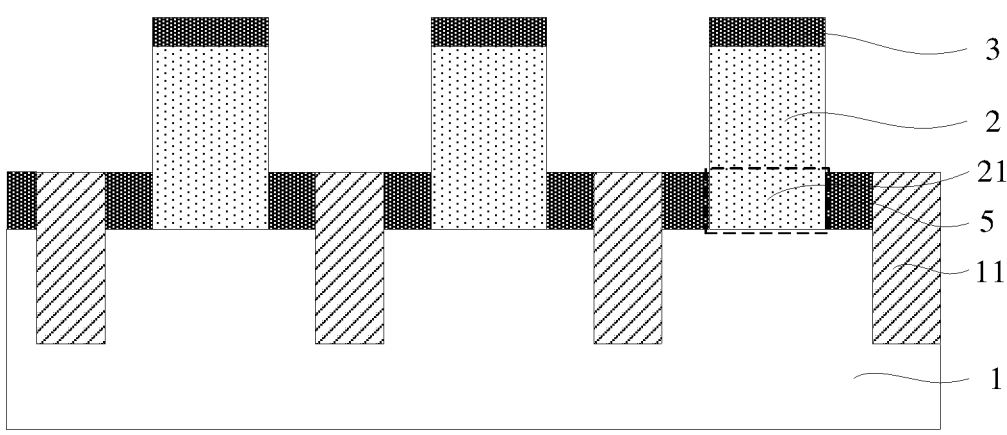
FIG. 16a is a schematic cross-sectional view of a structure obtained in step S403 in a first direction according to some embodiments.
Figure 16B:
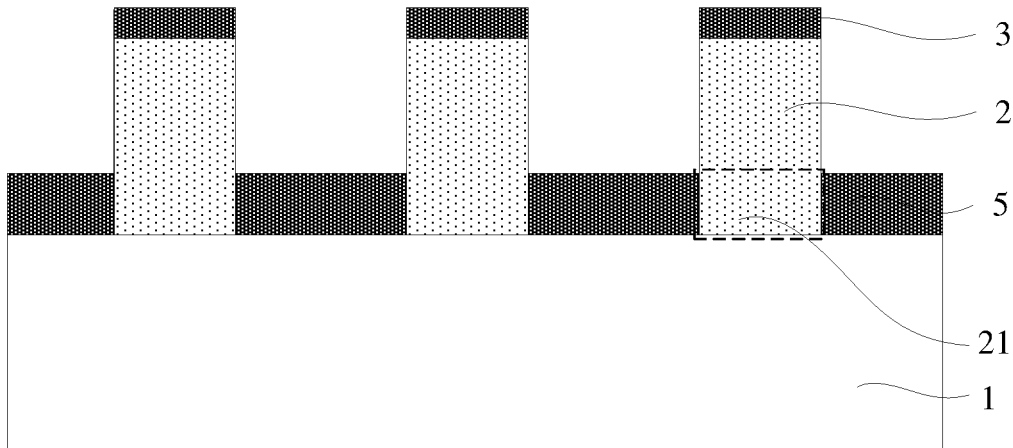
FIG. 16b is a schematic cross-sectional view of a structure obtained in step S403 in a second direction according to some embodiments.

In step S403, referring to S403 in FIG. 11 and referring to FIG. 16$a$ and FIG. 16$b$, the first sacrificial layer 40 is removed.

Figure 17A:
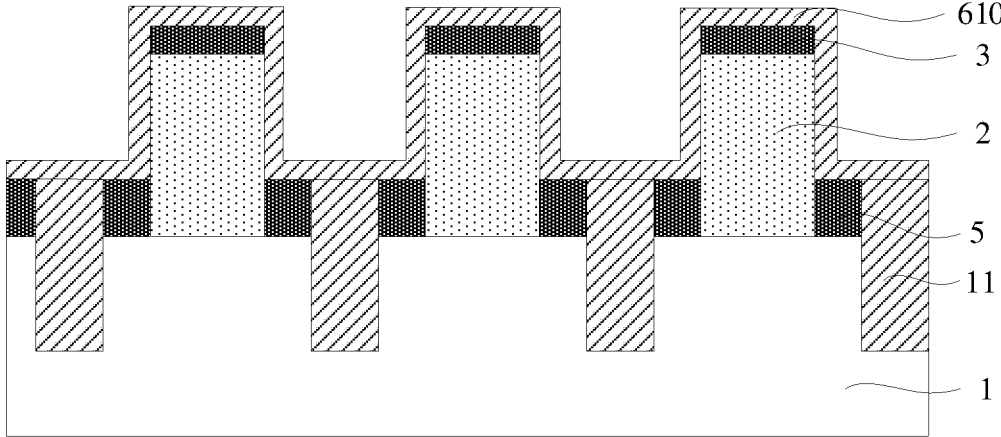
FIG. 17a is a schematic cross-sectional view of a structure obtained in step S600 in a first direction according to some embodiments.

In step S600, referring to FIG. 2, FIG. 3, FIG. 17$a$, and FIG. 17$b$, a first dielectric material layer 610 that covers the bit line 5, the conductive channel 22, the drain 23, and the contact plug 3 is formed.

In some embodiments, the first dielectric material layer 610 includes an oxide layer with a high dielectric constant, such as a silicon oxide layer. The first dielectric material layer 610 can be formed using a deposition process.

In step S700, referring to FIG. 2, FIG. 3, and FIG. 18, performing step S700, that is, forming a gate-all-around word line that corresponds and surrounds the conductive channel on a surface of the first dielectric material layer facing away from the conductive channel, includes the following steps:

S701: Deposit a metal material on the first dielectric material layer.

S702: Etch the metal material until an upper surface of the metal material is flush with an upper surface of the columnar structure, or an upper surface of the metal material is lower than an upper surface of the columnar structure, to obtain a metal pattern layer.

S703: Form a second sacrificial layer that covers an exposed surface of the first dielectric material layer and the metal pattern layer.

S704: Pattern the second sacrificial layer and etch the metal pattern layer based on a pattern of the second sacrificial layer to obtain the gate-all-around word line that corresponds and surrounds the conductive channel.

S705: Remove the second sacrificial layer.

Figure 19A:
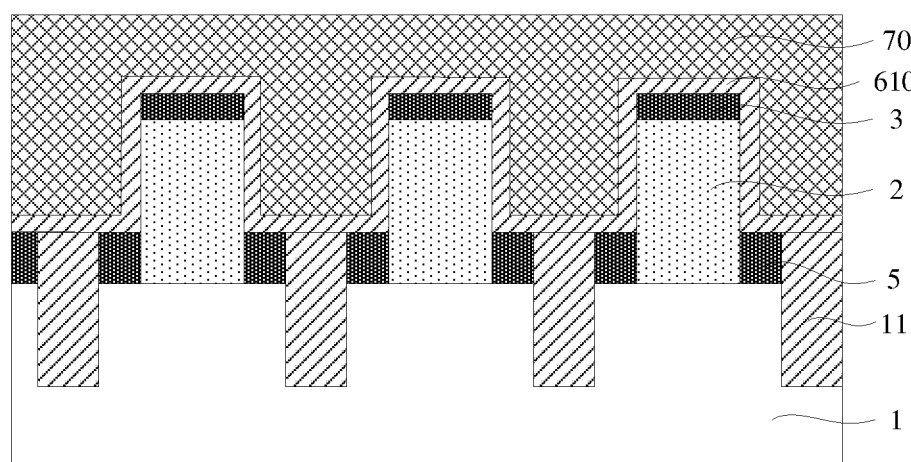
FIG. 19a is a schematic cross-sectional view of a structure obtained in step S701 in a first direction according to some embodiments.
Figure 19B:
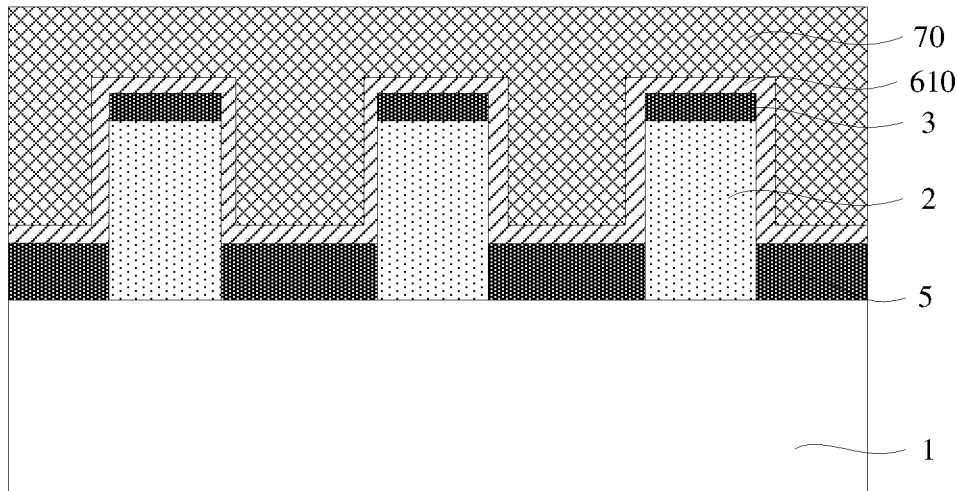
FIG. 19b is a schematic cross-sectional view of a structure obtained in step S701 in a second direction according to some embodiments.

In step S701, referring to S701 in FIG. 18 and referring to FIG. 19a and FIG. 19b, a metal material 70 is deposited on the first dielectric material layer 610.

In some embodiments, the metal material 70 includes tungsten metal. Alternatively, the metal material 70 is another metal material having good electrical conductivity, for example, molybdenum (Mo), aluminum (Al), or titanium (Ti).

Figure 20A:
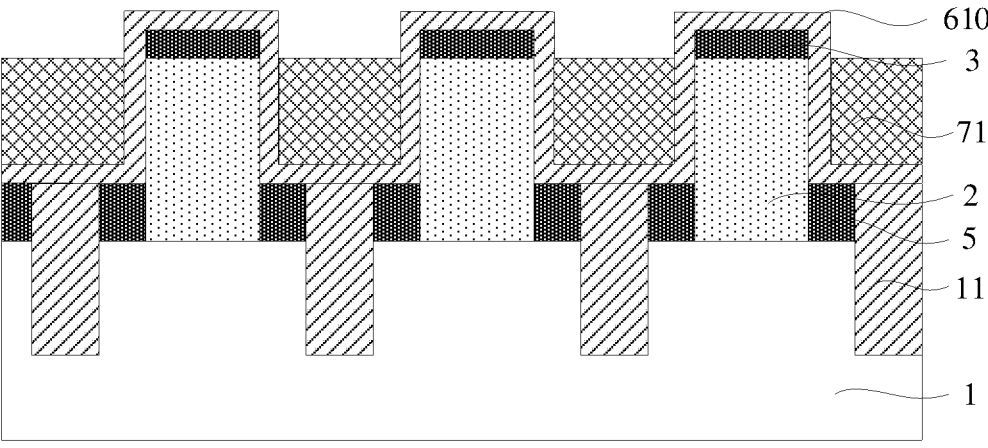
FIG. 20a is a schematic cross-sectional view of a structure obtained in step S702 in a first direction according to some embodiments.
Figure 20B:
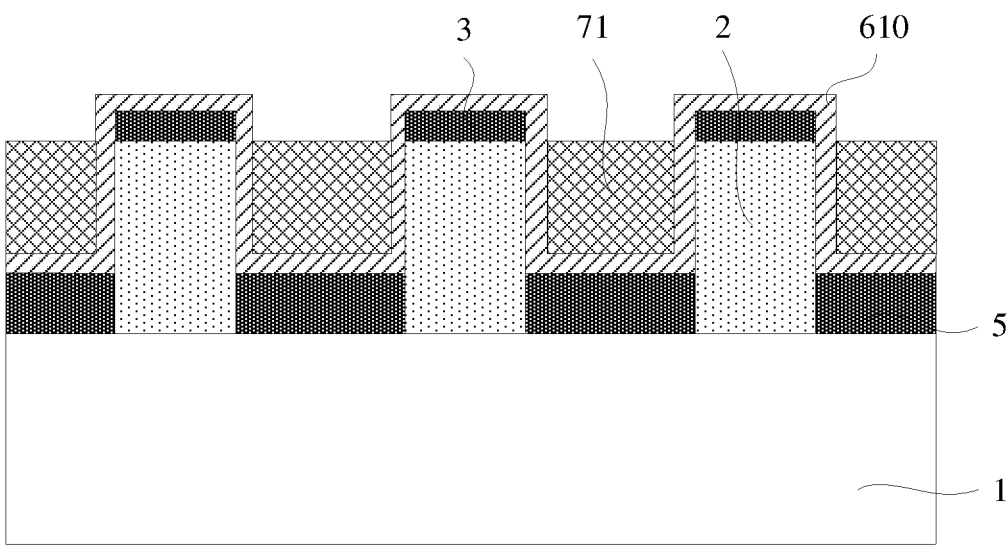
FIG. 20b is a schematic cross-sectional view of a structure obtained in step S702 in a second direction according to some embodiments.

In step S702, referring to S702 in FIG. 18 and referring to FIG. 20a and FIG. 20b, the metal material 70 is etched until the upper surface of the metal material 70 is flush with the upper surface of the columnar structure 2, or the upper surface of the metal material 70 is lower than the upper surface of the columnar structure 2, to obtain a metal pattern layer 71.

Figure 21A:
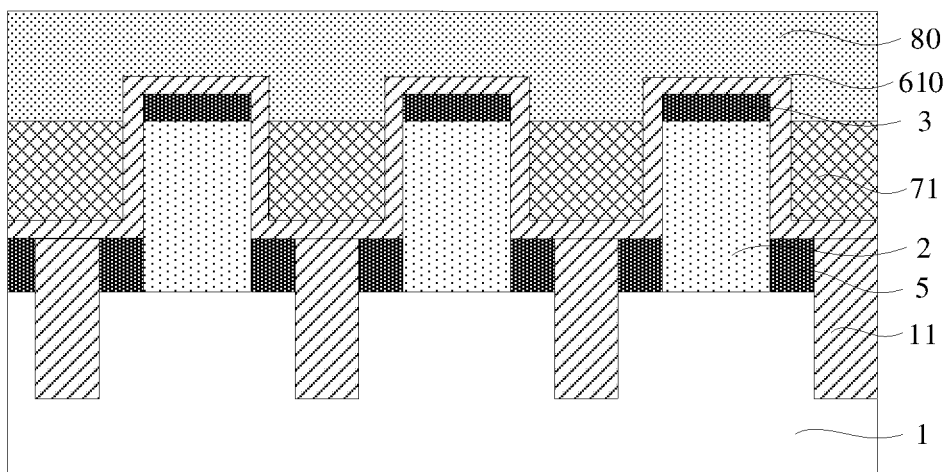
FIG. 21a is a schematic cross-sectional view of a structure obtained in step S703 in a first direction according to some embodiments.
Figure 21B:
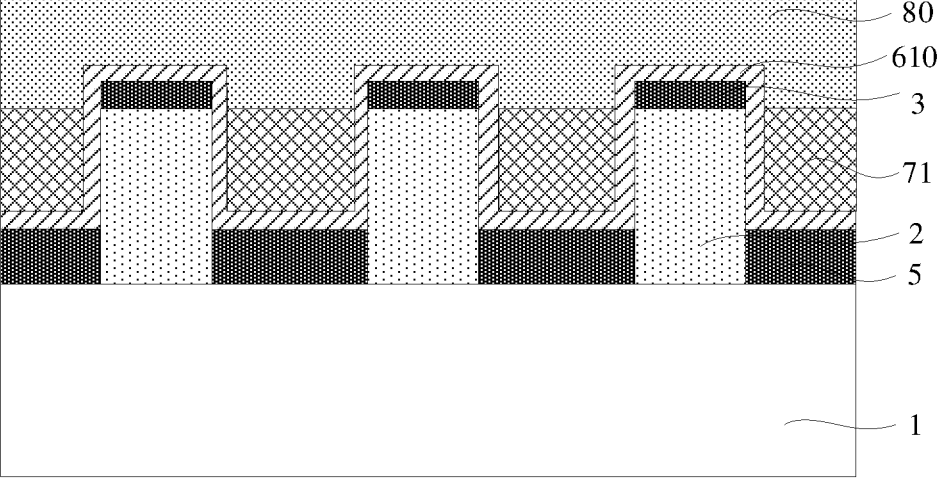
FIG. 21b is a schematic cross-sectional view of a structure obtained in step S703 in a second direction according to some embodiments.

In step S703, referring to S703 in FIG. 18 and referring to FIG. 21a and FIG. 21b, a second sacrificial layer 80 that covers an exposed surface of the first dielectric material layer 610 and the metal pattern layer 71 is formed.

In some embodiments, the second sacrificial layer 80 is formed using a spin coating process. The second sacrificial layer 80 is, for example, a photoresist layer.

Figure 22A:
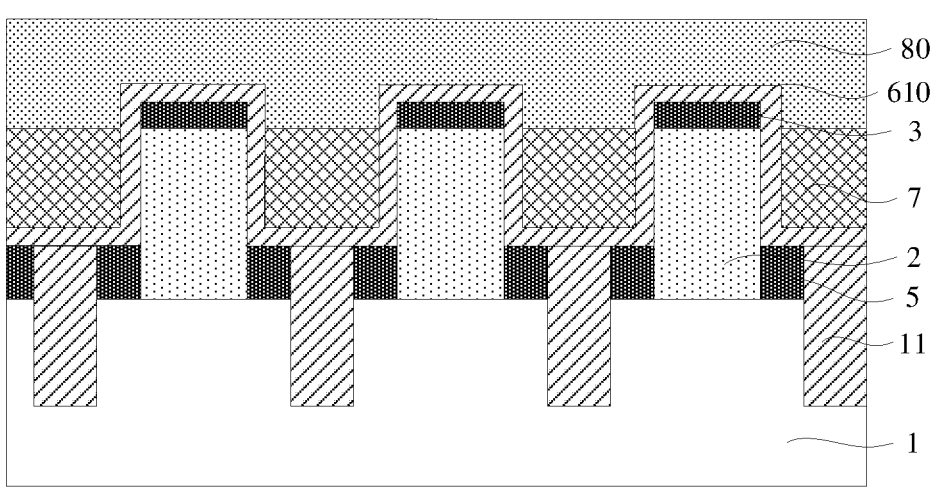
FIG. 22a is a schematic cross-sectional view of a structure obtained in step S704 in a first direction according to some embodiments.
Figure 22B:
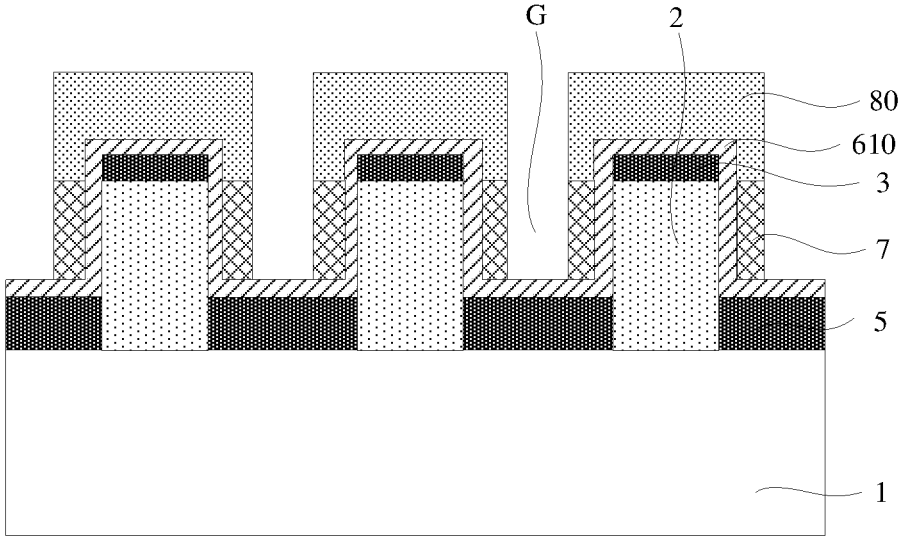
FIG. 22b is a schematic cross-sectional view of a structure obtained in step S704 in a second direction according to some embodiments.

In step S704, referring to S704 in FIG. 18 and referring to FIG. 22a and FIG. 22b, the second sacrificial layer 80 is patterned and the metal pattern layer 71 is etched based on the pattern of the second sacrificial layer 80 to obtain the gate-all-around word line 7 that corresponds and surrounds the conductive channel 22. There is an air gap G between adjacent gate-all-around word lines 7.

In some embodiments, the process of patterning the second sacrificial layer 80 is, for example, a wet etching process.

Figure 23A:
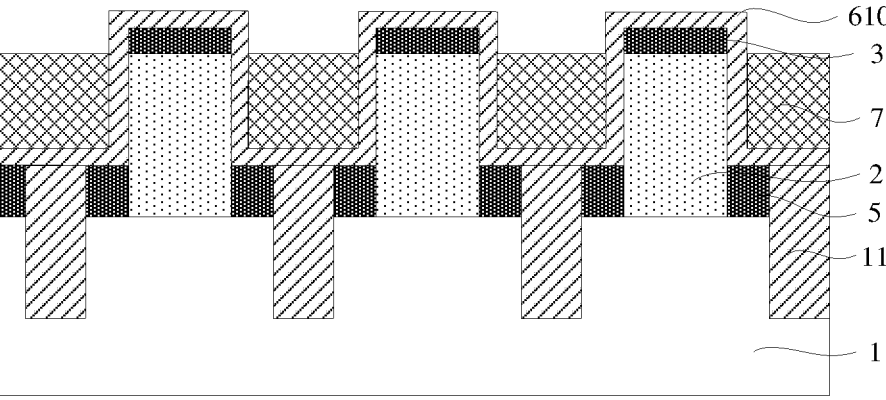
FIG. 23a is a schematic cross-sectional view of a structure obtained in step S705 in a first direction according to some embodiments.
Figure 23B:
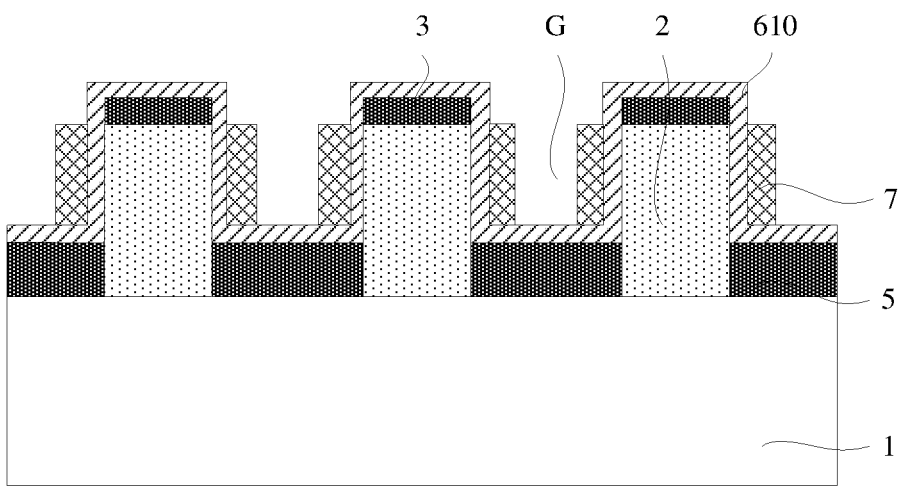
FIG. 23b is a schematic cross-sectional view of a structure obtained in step S705 in a second direction according to some embodiments.
Figure 24A:
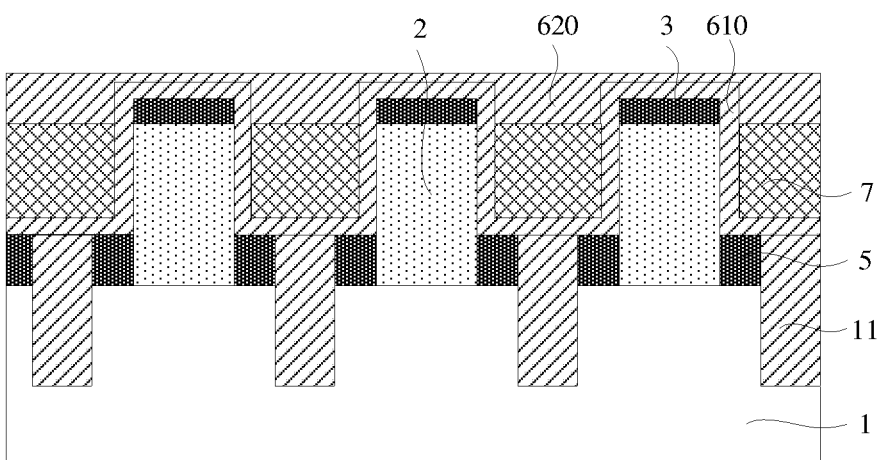
FIG. 24a is a schematic cross-sectional view of a structure obtained in step S800 in a first direction according to some embodiments.
Figure 24B:
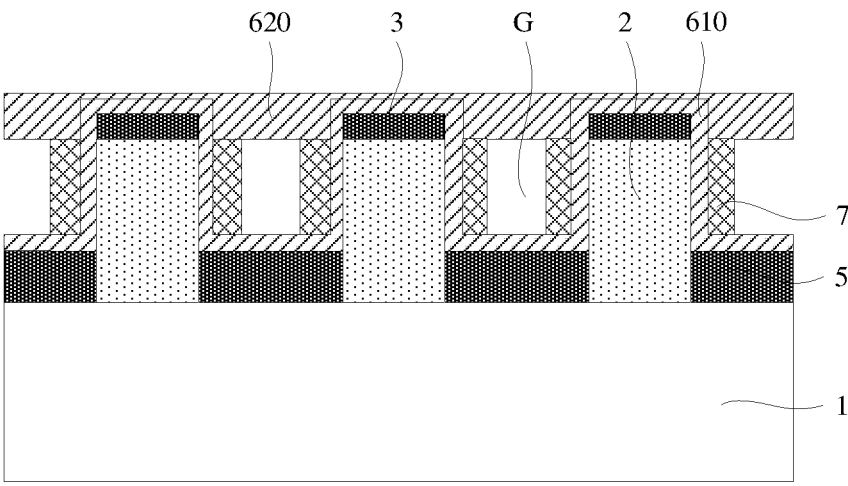
FIG. 24b is a schematic cross-sectional view of a structure obtained in step S800 in a second direction according to some embodiments.

In step S705, referring to S705 in FIG. 18 and referring to FIG. 23a and FIG. 23b, the second sacrificial layer 80 is removed.

In step S800, referring to FIG. 2, FIG. 3, FIG. 24a, and FIG. 24b, a second dielectric material layer 620 that covers the gate-all-around word line 7 is formed on a surface of the first dielectric material layer 610 facing away from the contact plug 3.

Here, the material of the second dielectric material layer 620 and the material of the first dielectric material layer 610 may be the same, for example, may be both silicon oxides. This facilitates subsequent etching through a single patterning process. In addition, the second dielectric material layer 620 can be formed using a deposition process.

Figure 25A:
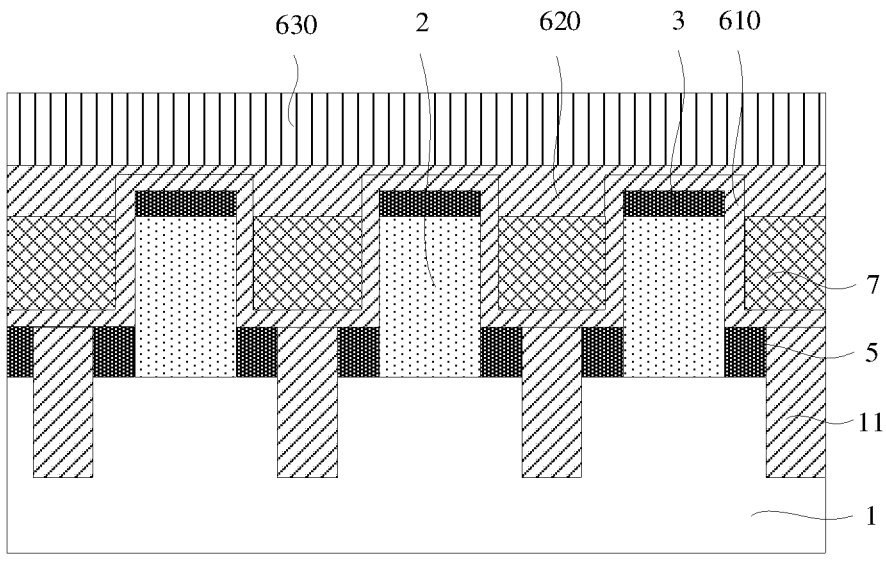
FIG. 25a is a schematic cross-sectional view of a structure obtained in step S850 in a first direction according to some embodiments.
Figure 25B:
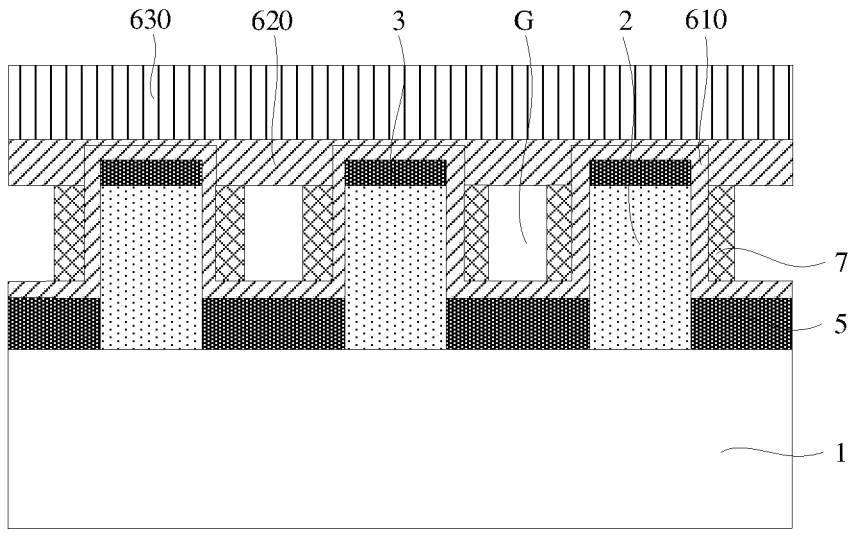
FIG. 25b is a schematic cross-sectional view of a structure obtained in step S850 in a second direction according to some embodiments.

In step S850, referring to FIG. 3, FIG. 25a, and FIG. 25b, a third dielectric material layer 630 is formed on the second dielectric material layer 620.

Here, the material of the third dielectric material layer 630 may be different from the material of the second dielectric material layer 620. For example, the material of the third dielectric material layer 630 is silicon nitride. In addition, the third dielectric material layer 630 can be formed using a deposition process, and the deposition thickness of the third dielectric material layer 630 can be selected and set according to the height dimension of a contact pad to be subsequently formed.

Figure 26A:
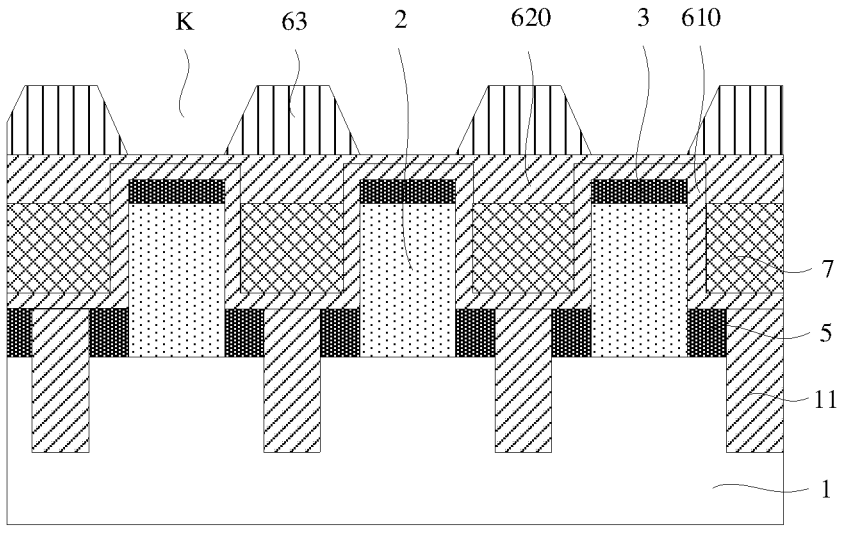
FIG. 26a is a schematic cross-sectional view of a structure obtained in step S860 in a first direction according to some embodiments.
Figure 26B:
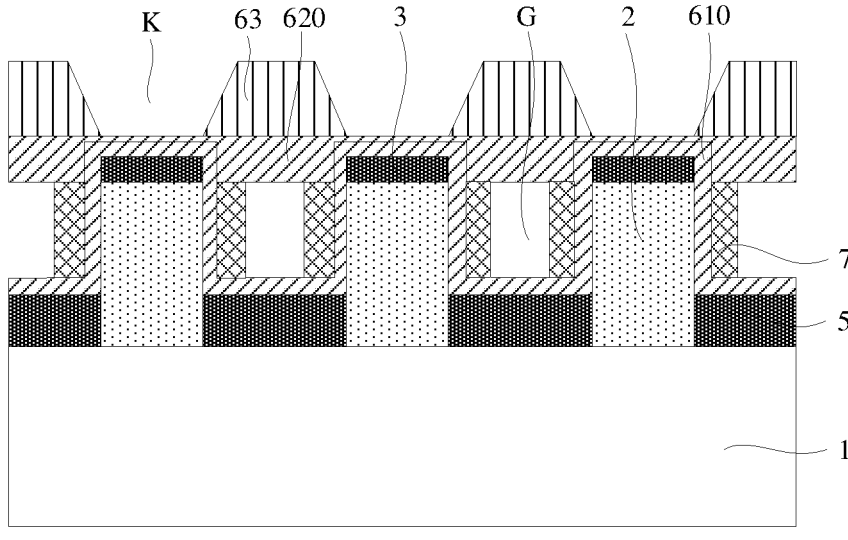
FIG. 26b is a schematic cross-sectional view of a structure obtained in step S860 in a second direction according to some embodiments.

In step S860, referring to FIG. 3, FIG. 26a, and FIG. 26b, a plurality of contact windows K are formed in the third dielectric material layer 630 to obtain a third dielectric layer 63.

Here, the contact windows K are configured to accommodate the contact pads, and the shape and distribution of the contact windows K can be determined based on the shape and distribution of contact pads to be subsequently formed.

In step S900, referring to FIG. 3, FIG. 27a, and FIG. 27b, the second dielectric material layer 620 and the first dielectric material layer 610 are etched based on the contact windows K to obtain a first dielectric layer 61 and a second dielectric layer 62. The contact plug 3 is exposed from the first dielectric layer 61 and the second dielectric layer 62.

In step S1000, referring to FIG. 3 and FIG. 28, performing step S1000, that is, forming a contact pad in contact with the contact plug in the contact window, includes the following steps:

S1001: Form a pad material layer in the contact window and on a surface of the third dielectric layer.

S1002: Remove the pad material layer on the surface of the third dielectric layer by using a chemical mechanical polishing process, where the pad material layer remaining in the contact window is the contact pad.

Figure 29A:
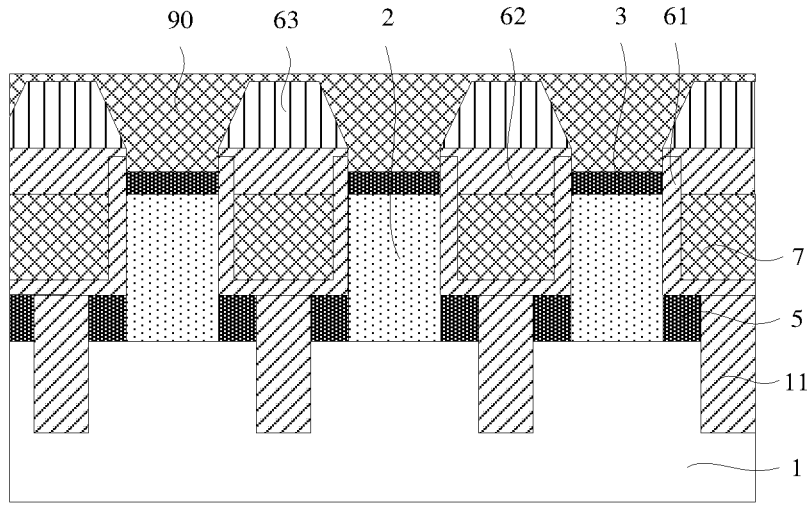
FIG. 29a is a schematic cross-sectional view of a structure obtained in step S1001 in a first direction according to some embodiments.
Figure 29B:
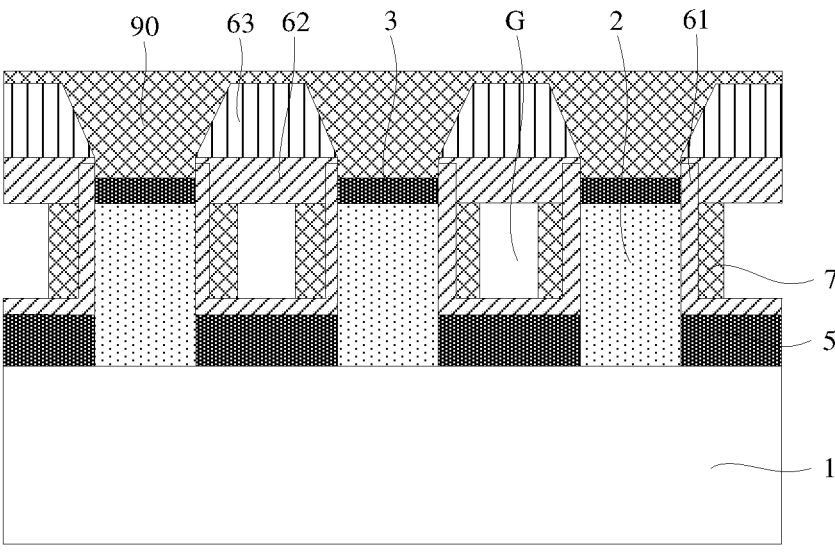
FIG. 29b is a schematic cross-sectional view of a structure obtained in step S1001 in a second direction according to some embodiments.

In step S1001, referring to S1001 in FIG. 28 and referring to FIG. 29a and FIG. 29b, a pad material layer 90 is formed in the contact window K and on a surface of the third dielectric layer 63. In some embodiments, the pad material layer 90 is a tungsten metal layer.

Figure 30A:
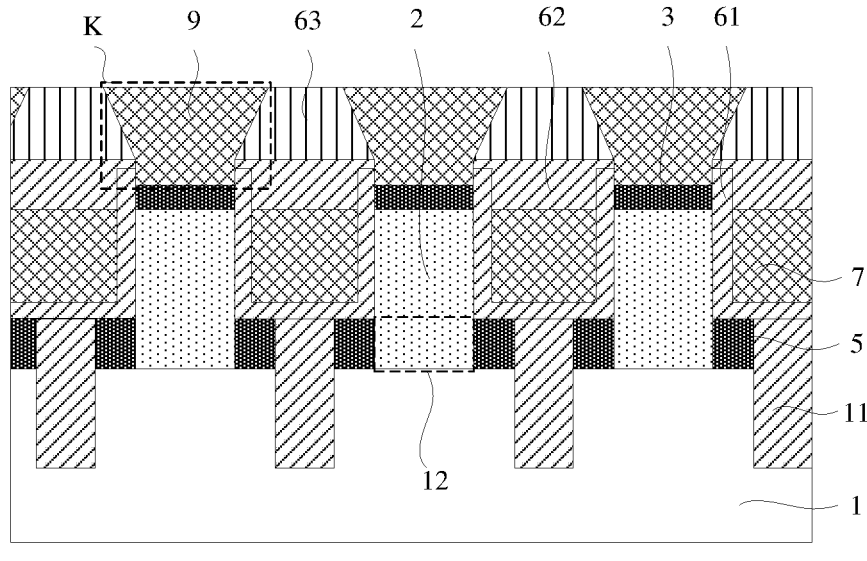
FIG. 30a is a schematic cross-sectional view of a structure obtained in step S1002 in a first direction according to some embodiments.
Figure 30B:
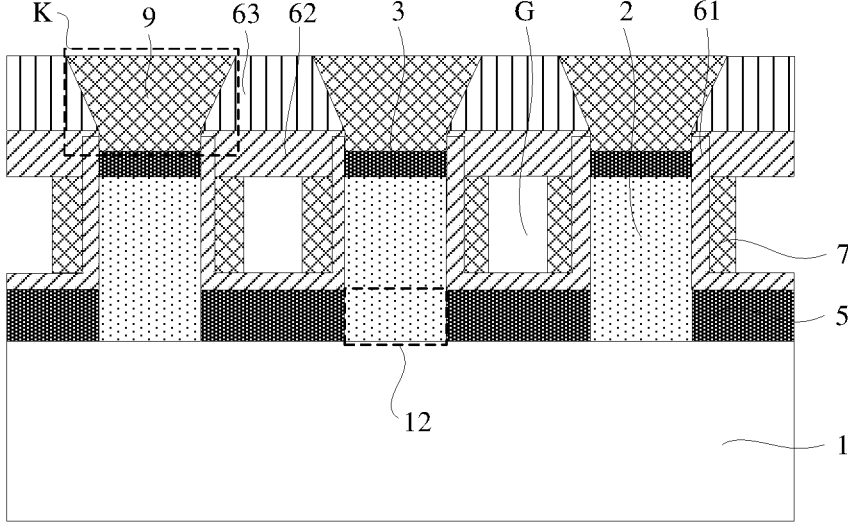
FIG. 30b is a schematic cross-sectional view of a structure obtained in step S1002 in a second direction according to some embodiments.

In step S1002, referring to S1002 in FIG. 28 and referring to FIG. 30a and FIG. 30b, the pad material layer 90 on the surface of the third dielectric layer 63 is removed by using a chemical mechanical polishing process, where the pad material layer remaining in the contact window K is the contact pad 9.

In some embodiments of this invention, a chemical mechanical polishing process is used to form the contact pad 9, which can ensure the flatness of the surface of the contact pad 9 so as to facilitate subsequent formation of the other electrical devices such as a storage capacitor on the surface of the contact pad 9. It also ensures that the contact pad 9 is in good contact with the electrical devices, thereby ensuring the electrical contact performance of the contact pad 9.

Some embodiments of this invention further provide a semiconductor structure, which is fabricated using the fabrication method in some embodiments described above.

Figure 31:
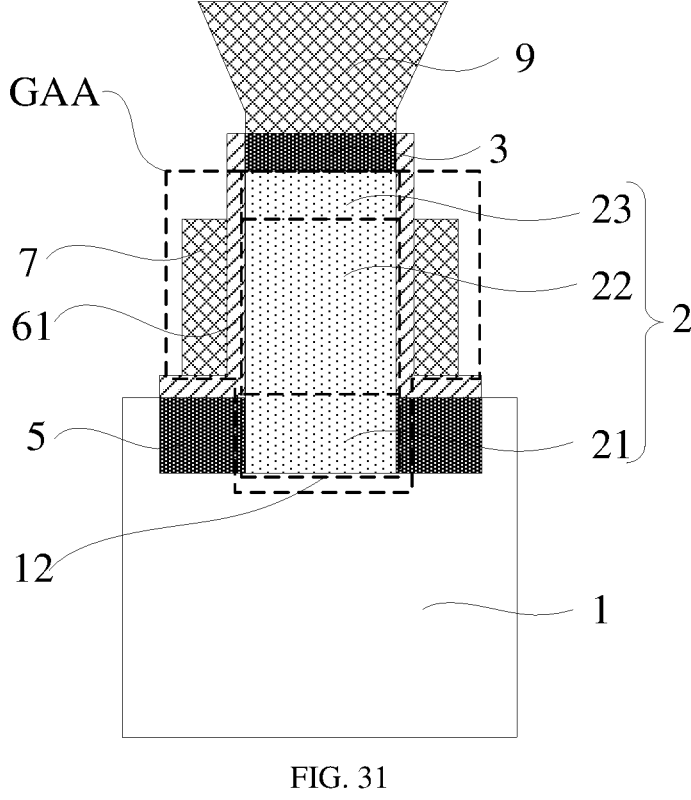
FIG. 31 is a schematic cross-sectional view of a GAA according to some embodiments.

Referring to FIG. 30a, FIG. 30b, and FIG. 31, the semiconductor structure includes a substrate 1, a transistor accommodating groove 12, a columnar structure 2, and a bit line 5. A shallow trench isolation structure 11 is formed on the substrate 1, and configured to isolate a plurality of active regions arranged at intervals in the substrate 1. The transistor accommodating groove 12 is located in the active region, and there is a spacing between the transistor accommodating groove 12 and the shallow trench isolation structure 11. The columnar structure 2 is located in the transistor accommodating groove 12 and includes a source 21, a conductive channel 22, and a drain 23 that are sequentially disposed in a direction away from the substrate 1. The bit line 5 is located within the spacing L and surrounds and connects the source 21.

In some embodiments, the substrate 1 includes, but is not limited to, a silicon substrate or a silicon-based substrate. In some embodiments, the substrate 1 is a sapphire substrate, a silicon substrate, or a silicon carbide substrate.

In some embodiments, the material of the active region is, for example, polysilicon (poly). The shallow trench isolation structure 11 is, for example, a silicon oxide ($SiO_2$) isolation structure.

In some embodiments, the material of the columnar structure 2 includes molybdenum disulfide; and/or the material of the bit line 5 includes bismuth metal. Certainly, the material of the columnar structure may be another two-dimensional semiconductor material, and the material of the bit line may be another material that is not easily alloyed with the two-dimensional semiconductor material to destroy the two-dimensional crystalline structure. For example, the material of the columnar structure is molybdenum diselenide ($MoSe_2$), tungsten disulfide ($WS_2$), tungsten diselenide ($WSe_2$), or bismuth selenide ($Bi_2Se_3$). The material of the bit line is chromium (Cr), cadmium (Cd), iridium (Jr), niobium (Nb), tantalum (Ta), tellurium (Te), or tungsten (W).

In some embodiments of this invention, the bit line 5 surrounds and connects the source 21. This can increase the contact area between the bit line 5 and the source 21 can be large, thereby reducing the contact resistance between the bit line 5 and the source 21 (that is, the contact resistance between the bit line 5 and the GAA transistor), and improving the electrical performance of the semiconductor structure.

In some embodiments, the material of the columnar structure 2 includes molybdenum disulfide ($MoS_2$) and the material of the bit line 5 includes bismuth (Bi) metal. As such, a two-dimensional crystalline structure of the columnar structure 2 is not easily destroyed due to its contact with the bit line 5, and the contact resistance between the bit line 5 and the GAA transistor can be further reduced to ensure that the GAA transistor has low power consumption performance and high frequency performance, thereby further improving the electrical performance of the semiconductor structure.

In some embodiments, the semiconductor structure further includes a contact plug 3, a first dielectric layer 61, a gate-all-around word line 7, and a second dielectric layer 62. The contact plug 3 is located on a surface of the drain 23 facing away from the conductive channel 22. The first dielectric layer 61 covers the bit line 5 and is located on a sidewall of the conductive channel 22, the drain 23, and the contact plug 3. The gate-all-around word line 7 is located on a surface of the first dielectric layer 61 facing away from the conductive channel 22 and surrounds the conductive channel 22. The second dielectric layer 62 is located on a surface of the first dielectric layer 61 facing away from the contact plug 3 and covers the gate-all-around word line 7. There is an air gap G between adjacent gate-all-around word lines 7.

In some embodiments, the material of the contact plug 3 includes bismuth (Bi) metal. Alternatively, the material of the contact plug 3 may be chromium (Cr), cadmium (Cd), iridium (Ir), niobium (Nb), tantalum (Ta), tellurium (Te), or tungsten (W). This can ensure that there is also a low contact resistance between the contact plug and the transistor.

In some embodiments, the first dielectric layer 61 is an oxide layer with a high dielectric constant, such as a silicon oxide layer. The material of the second dielectric layer 62 may be the same as the material of the first dielectric layer 61.

In some embodiments, the material of the gate-all-around word line 7 is tungsten (W), molybdenum (Mo), aluminum (Al), titanium (Ti), or the like.

In some embodiments, the semiconductor structure further includes a third dielectric layer 63 and a contact pad 9. The third dielectric layer 63 has a contact window K and covers at least the second dielectric layer 62. The contact pad 9 is located in the contact window K and is in contact with the contact plug 3.

In some embodiments, the material of the third dielectric layer 63 may be different from the material of the second dielectric layer 62. For example, the material of the third dielectric layer 63 is silicon nitride.

In some embodiments, the contact pad 9 is a tungsten pad.

The technical features of the some embodiments described above can be combined arbitrarily. For brevity of description, not all possible combinations of the technical features of the some embodiments are described. However, the combinations of these technical features should be considered as falling within the scope of this specification provided that there is no contradiction between the combinations.

The above embodiments merely describe some implementations of this invention in a relatively specific and detailed manner, but should not be understood as a limitation on the scope of this invention. It should be noted that a person of ordinary skill in the art can make any variations or improvements without departing from the concept of this invention, and these variations and improvements shall fall within the protection scope of this invention. Therefore, the protection scope of this invention shall be subject to the appended claims.

What is claimed is:

1. A method for fabricating a semiconductor structure, comprising:

providing a substrate, wherein a plurality of shallow trench isolation structures are formed in the substrate, and configured to isolate a plurality of active regions arranged at intervals in the substrate;

forming a plurality of transistor accommodating grooves in an active region, wherein there is a spacing between an transistor accommodating groove and a shallow trench isolation structure;

forming a columnar structure in the transistor accommodating groove, wherein the columnar structure comprises a source, a conductive channel, and a drain that are sequentially disposed in a direction away from the substrate;

forming a contact plug on the drain;

etching the active region located within the spacing and located between adjacent columnar structures to form a bit line trench, wherein the bit line trench surrounds the source;

forming a bit line that surrounds and contacts a sidewall of the source in the bit line trench, wherein the bit line is located within the spacing and located between adjacent columnar structures and the sidewall of the source is perpendicular to the substrate;

forming a first dielectric material layer that covers the bit line, the conductive channel, the drain, and the contact plug;

forming a gate-all-around word line that corresponds and surrounds the conductive channel on a surface of the first dielectric material layer facing away from the conductive channel, wherein there is an air gap between adjacent gate-all-around word lines;

forming a second dielectric material layer that covers the gate-all-around word line on a surface of the first dielectric material layer facing away from the contact plug; and etching the second dielectric material layer and the first dielectric material layer to obtain a first dielectric layer and a second dielectric layer, wherein the contact plug is exposed from the first dielectric layer and the second dielectric layer.

2. The method for fabricating a semiconductor structure according to claim 1, wherein the forming a columnar structure in the transistor accommodating groove comprises:

filling a semiconductor material in the transistor accommodating groove to form the source;

depositing the semiconductor material on the substrate to form a semiconductor film that covers the source; and patterning the semiconductor film to form the drain and the conductive channel, wherein each of an orthographic projection of the drain on the substrate and an orthographic projection of the conductive channel on the substrate overlaps an orthographic projection of the source on the substrate.

3. The method for fabricating a semiconductor structure according to claim 1, wherein the etching the active region located within the spacing and located between adjacent columnar structures to form a bit line trench comprises:

forming a first sacrificial layer that covers an exposed surface of the columnar structure and an exposed surface of the substrate;

patterning the first sacrificial layer and etching the active region located within the spacing and located between adjacent columnar structures based on a pattern of the first sacrificial layer; and removing the first sacrificial layer.

4. The method for fabricating a semiconductor structure according to claim 1, wherein the forming a gate-all-around word line that corresponds and surrounds the conductive channel on a surface of the first dielectric material layer facing away from the conductive channel comprises:

depositing a metal material on the first dielectric material layer;

etching the metal material until an upper surface of the metal material is flush with an upper surface of the columnar structure, or an upper surface of the metal material is lower than an upper surface of the columnar structure, to obtain a metal pattern layer;

forming a second sacrificial layer that covers an exposed surface of the first dielectric material layer and the metal pattern layer;

patterning the second sacrificial layer and etching the metal pattern layer based on a pattern of the second sacrificial layer to obtain the gate-all-around word line that corresponds and surrounds the conductive channel; and removing the second sacrificial layer.

5. The method for fabricating a semiconductor structure according to claim 4, wherein the metal material comprises tungsten metal.

6. The method for fabricating a semiconductor structure according to claim 1, wherein before the etching the second dielectric material layer and the first dielectric material layer, the method further comprises: forming a third dielectric material layer on the second dielectric material layer; and forming a plurality of contact windows in the third dielectric material layer to obtain a third dielectric layer;

the etching the second dielectric material layer and the first dielectric material layer to obtain the first dielectric layer and the second dielectric layer, wherein the contact plug is exposed from the first dielectric layer and the second dielectric layer comprises: etching the second dielectric material layer and the first dielectric material layer based on the contact windows to obtain the first dielectric layer and the second dielectric layer, wherein the contact plug is exposed from the first dielectric layer and the second dielectric layer; and after the etching the second dielectric material layer and the first dielectric material layer to obtain the first dielectric layer and the second dielectric layer, wherein the contact plug is exposed from the first dielectric layer and the second dielectric layer, the method further comprises: forming a contact pad in contact with the contact plug in the contact window.

7. The method for fabricating a semiconductor structure according to claim 6, wherein the forming a contact pad in contact with the contact plug in the contact window comprises:

forming a pad material layer in the contact window and on a surface of the third dielectric layer; and removing the pad material layer on the surface of the third dielectric layer by using a chemical mechanical polishing process, wherein the pad material layer remaining in the contact window is the contact pad.

8. The method for fabricating a semiconductor structure according to claim 1, wherein a material of the bit line and/or the contact plug comprises bismuth metal.

9. The method for fabricating a semiconductor structure according to claim 1, wherein a material of the columnar structure comprises molybdenum disulfide.

10. The method for fabricating a semiconductor structure according to claim 3, wherein the forming the bit line that surrounds and contacts the sidewall of the source in the bit line trench comprises:

forming a bit line material layer that fills the bit line trench and covers an exposed surface of the first sacrificial layer;

patterning the bit line material layer to form the bit line that surrounds and contacts the sidewall of the source in the bit line trench.

11. A semiconductor structure, comprising:

a substrate, wherein a plurality of shallow trench isolation structures are formed in the substrate, and configured to isolate a plurality of active regions arranged at intervals in the substrate;

a transistor accommodating groove, wherein the transistor accommodating groove is located in the active region, and there is a spacing between the transistor accommodating groove and the shallow trench isolation structure;

a columnar structure, wherein the columnar structure is located in the transistor accommodating groove and comprises a source, a conductive channel, and a drain that are sequentially disposed in a direction away from the substrate;

a bit line, wherein the bit line is located within the spacing and located between adjacent columnar structures, and the bit line surrounds and contacts a sidewall of the source that is perpendicular to the substrate;

a contact plug, wherein the contact plug is located on a surface of the drain facing away from the conductive channel;

a first dielectric layer, wherein the first dielectric layer covers the bit line and is located on a sidewall of the conductive channel, the drain, and the contact plug;

a gate-all-around word line, wherein the gate-all-around word line is located on a surface of the first dielectric layer facing away from the conductive channel and surrounds the conductive channel; and a second dielectric layer, wherein the second dielectric layer is located on a surface of the first dielectric layer facing away from the contact plug and covers the gate-all-around word line, wherein there is an air gap between adjacent gate-all-around word lines.

12. The semiconductor structure according to claim 11, wherein a material of the columnar structure comprises molybdenum disulfide; and/or a material of the bit line comprises bismuth metal.

13. The semiconductor structure according to claim 11, wherein the semiconductor structure further comprises:

a third dielectric layer, wherein the third dielectric layer has a contact window and covers at least the second dielectric layer; and a contact pad, wherein the contact pad is located in the contact window and is in contact with the contact plug.

14. The semiconductor structure according to claim 11, wherein a material of the contact plug comprises bismuth metal.

* * * * *